US010720347B2

(12) United States Patent
Fujisawa

(10) Patent No.: US 10,720,347 B2
(45) Date of Patent: Jul. 21, 2020

(54) SHEET EXPANDING APPARATUS

(71) Applicant: DISCO CORPORATION, Tokyo (JP)

(72) Inventor: Shinichi Fujisawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/215,745

(22) Filed: Dec. 11, 2018

(65) Prior Publication Data
US 2019/0189476 A1    Jun. 20, 2019

(30) Foreign Application Priority Data

Dec. 18, 2017   (JP) .................................. 2017-241715

(51) Int. Cl.
*H01L 21/67* (2006.01)
*H01L 21/687* (2006.01)
*H01L 21/683* (2006.01)
*B32B 38/00* (2006.01)

(52) U.S. Cl.
CPC .. *H01L 21/67132* (2013.01); *H01L 21/67092* (2013.01); *H01L 21/6836* (2013.01); *H01L 21/68728* (2013.01); *H01L 2221/68336* (2013.01)

(58) Field of Classification Search
CPC ......... H01L 21/67132; H01L 21/67092; H01L 21/68728; H01L 21/6836; H01L 2221/68336; B32B 38/0004
See application file for complete search history.

(56) References Cited

U.S. PATENT DOCUMENTS

2008/0169056 A1*  7/2008  Yamamoto .............. B29C 63/02
                                                                156/152
2016/0240424 A1*  8/2016  Tsukamoto ......... H01L 21/6836
2018/0161919 A1*  6/2018  Yamada ............ H01L 21/67092

FOREIGN PATENT DOCUMENTS

JP          2014022382 A      2/2014

* cited by examiner

*Primary Examiner* — Mark A Osele
*Assistant Examiner* — Christopher C Caillouet
(74) *Attorney, Agent, or Firm* — Greer Burns & Crain, Ltd.

(57) ABSTRACT

A sheet expanding apparatus includes: an adhering mechanism including an adhering roller by which a belt-shaped sheet wound in a roll form is adhered to a plate-shaped body, and a cutter adapted to cut the belt-shaped sheet into a rectangular sheet larger in size than the plate-shaped body; an expanding mechanism adapted to expand the rectangular sheet in a first direction and a second direction; and a transfer unit by which the plate-shaped body having the rectangular sheet adhered thereto is transferred to the expanding mechanism. The belt-shaped sheet can be supplied to the sheet expanding apparatus in the state of being wound in the roll form, and the plate-shaped body can be transferred by the transfer unit and the rectangular sheet can be expanded, after the belt-shaped sheet is adhered to the plate-shaped body and is cut into the rectangular sheet in the sheet expanding apparatus.

4 Claims, 17 Drawing Sheets

SHEET EXPANDING APPARATUS

BACKGROUND OF THE INVENTION

Field of the Invention

The present invention relates to a sheet expanding apparatus for expanding a sheet.

Description of the Related Art

A workpiece such as a wafer is formed with devices in regions partitioned by a plurality of intersecting division lines (streets) formed in a grid form on a front surface thereof, and is divided along the division lines into individual chips having the devices. As an apparatus for dividing the wafer into the individual chips, there has been used, for example, a sheet expanding apparatus for clamping the four sides of a sheet and expanding the sheet (see, for example, Japanese Patent Laid-open No. 2014-022382). This sheet expanding apparatus includes first clamping means and second clamping means which are disposed oppositely on opposite sides of the workpiece in regard of a first direction and respectively clamp the sheet, and third clamping means and the fourth clamping means which are disposed oppositely on opposite sides of the workpiece in regard of a second direction orthogonal to the first direction and respectively clamp the sheet.

SUMMARY OF THE INVENTION

However, the above-mentioned sheet expanding apparatus is one for expanding a sheet adhered to a workpiece, and it has been necessary to cut the sheet, which is normally supplied in a roll form, separately by an operator and to adhere the workpiece to the thus cut sheet. In addition, it is necessary for the operator to place the workpiece on a holding table through the sheet while positioning the sheet in such a manner that the four corners of the sheet can be clamped by clamping mechanisms, which is laborious, and, in some cases, it is necessary to re-place the workpiece which has once been placed on the holding table. Particularly, a workpiece formed with start points of division is liable to be broken or damaged, and, therefore, there has been the possibility of breaking or damaging the workpiece at the time of handling the workpiece, such as at the time of adhering the sheet, or once placing the workpiece on the holding table and then lifting it up.

It is therefore an object of the present invention to provide a sheet expanding apparatus by which workability can be enhanced as compared to the related art and the possibility of breaking or damaging a workpiece can be lowered.

In accordance with an aspect of the present invention, there is provided a sheet expanding apparatus for expanding a sheet, including: a holding unit having a holding surface adapted to hold a plate-shaped body; an adhering mechanism including an adhering roller by which a belt-shaped sheet wound in a roll form is adhered to the plate-shaped body held by the holding unit, and a cutter adapted to cut the belt-shaped sheet into a rectangular sheet larger in size than the plate-shaped body; moving means moving the adhering roller relative to the holding unit in an adhering direction of adhering the belt-shaped sheet; an expanding mechanism including first clamping means and second clamping means which are disposed oppositely on opposite sides of the plate-shaped body with the rectangular sheet adhered thereto in regard of a first direction and which clamp outer edges of the rectangular sheet adhered to the plate-shaped body by the adhering mechanism, third clamping means and fourth clamping means which are disposed oppositely on opposite sides of the plate-shaped body with the rectangular sheet adhered thereto in regard of a second direction orthogonal to the first direction and which clamp outer edges of the rectangular sheet, and direction moving means by which the first clamping means and the second clamping means can be moved for spacing away from each other in the first direction and by which the third clamping means and the fourth clamping means can be moved for spacing away from each other in the second direction; and a transfer unit by which the plate-shaped body being held by the holding unit and having the rectangular sheet adhered thereto is transferred to the expanding mechanism.

Preferably, the holding unit includes a plate-shaped body holding section which includes the holding surface and holds the plate-shaped body, and sheet adhered sections which are disposed on an adhesion starting side and an adhesion finishing side on opposite sides of the holding surface in regard of the adhering direction in a periphery of the plate-shaped body holding section and which protrude beyond a sheet adhered surface of the plate-shaped body held by the holding surface; and the adhering mechanism includes a let-off section which is disposed to face the plate-shaped body held by the holding unit and lets off the belt-shaped sheet wound in the roll form, and sheet adhering means adhering one end of the belt-shaped sheet let off by the let-off section to the sheet adhered section on the adhesion starting side.

Preferably, the transfer unit includes a transfer unit holding section by which the plate-shaped body being held by the holding unit and having the rectangular sheet adhered thereto is held through the rectangular sheet, and corner portion clamping means respectively clamping corner portions of the rectangular sheet in a periphery of the transfer unit holding section.

Preferably, the belt-shaped sheet includes a base sheet and a glue layer disposed on the base sheet, and is wound in the roll form in a state in which a belt-shaped release film is disposed on the glue layer; and the adhering mechanism includes a peel plate adapted to peel off the belt-shaped release film from the belt-shaped sheet let off by the let-off section, a take-up section adapted to take up the peeled belt-shaped release film, and a weight adapted to press down the belt-shaped release film between the peel plate and the take-up section.

According to the present invention, the belt-shaped sheet can be supplied to the sheet expanding apparatus in the state of being wound in the roll form. In addition, the belt-shaped sheet can be adhered to the plate-shaped body and can be cut into the rectangular sheet larger in size than the plate-shaped body, in the sheet expanding apparatus. Therefore, workability is enhanced as compared to the related art.

Further, at the time of adhering the belt-shaped sheet to the plate-shaped body, the state in which the plate-shaped body is held by the holding unit is maintained; in addition, after the rectangular sheet is adhered to the plate-shaped body and until it is transferred to the expanding mechanism, the state in which the plate-shaped body is held by the transfer unit is maintained; besides, after the plate-shaped body is transferred to the expanding mechanism and until the rectangular sheet is attached to the annular frame, the state in which outer edges of the rectangular sheet are clamped by the first clamping means, the second clamping means, the third clamping means and the fourth clamping means is always maintained. Accordingly, the possibility of breaking or damaging the plate-shaped body can be lowered.

The holding unit further includes the plate-shaped body holding section which includes the holding surface and holds the plate-shaped body, and the sheet adhered sections which are disposed on the adhesion starting side and the adhesion finishing side on opposite sides of the holding surface in regard of the adhering direction in the periphery of the plate-shaped body holding section and which protrude beyond the sheet adhered surface of the plate-shaped body held by the holding surface. The adhering mechanism further includes the let-off section which is disposed to face the plate-shaped body held by the holding unit and lets off the belt-shaped sheet wound in the roll form, and the sheet adhering means adhering one end of the belt-shaped sheet let off by the let-off section to the sheet adhered section on the adhesion starting side. Therefore, the belt-shaped sheet can be favorably adhered to the plate-shaped body without generation of wrinkling.

The transfer unit includes the transfer unit holding section by which the plate-shaped body being held by the holding unit and having the rectangular sheet adhered thereto is held through the rectangular sheet, and the corner portion clamping means respectively clamping the corner portions of the rectangular sheet in the periphery of the transfer unit holding section. Accordingly, it is made possible to clamp the corner portions of the rectangular sheet adhered to the plate-shaped body and to transfer the plate-shaped body reliably to the expanding mechanism without breaking or damaging the plate-shaped body.

The belt-shaped sheet includes the base sheet and the glue layer disposed on the base sheet, and is wound in the roll form in the state in which the belt-shaped release film is disposed on the glue layer, and the adhering mechanism includes the peel plate adapted to peel off the belt-shaped release film from the belt-shaped sheet let off by the let-off section, the take-up section adapted to take up the peeled belt-shaped release film, and the weight adapted to press down the belt-shaped release film between the peel plate and the take-up section. Therefore, during when the base sheet is adhered to the plate-shaped body, a constant tension can be exerted by pressing down the belt-shaped release film, which has been peeled off from the belt-shaped sheet, by the weight. Accordingly, the base sheet can be prevented from wrinkling.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
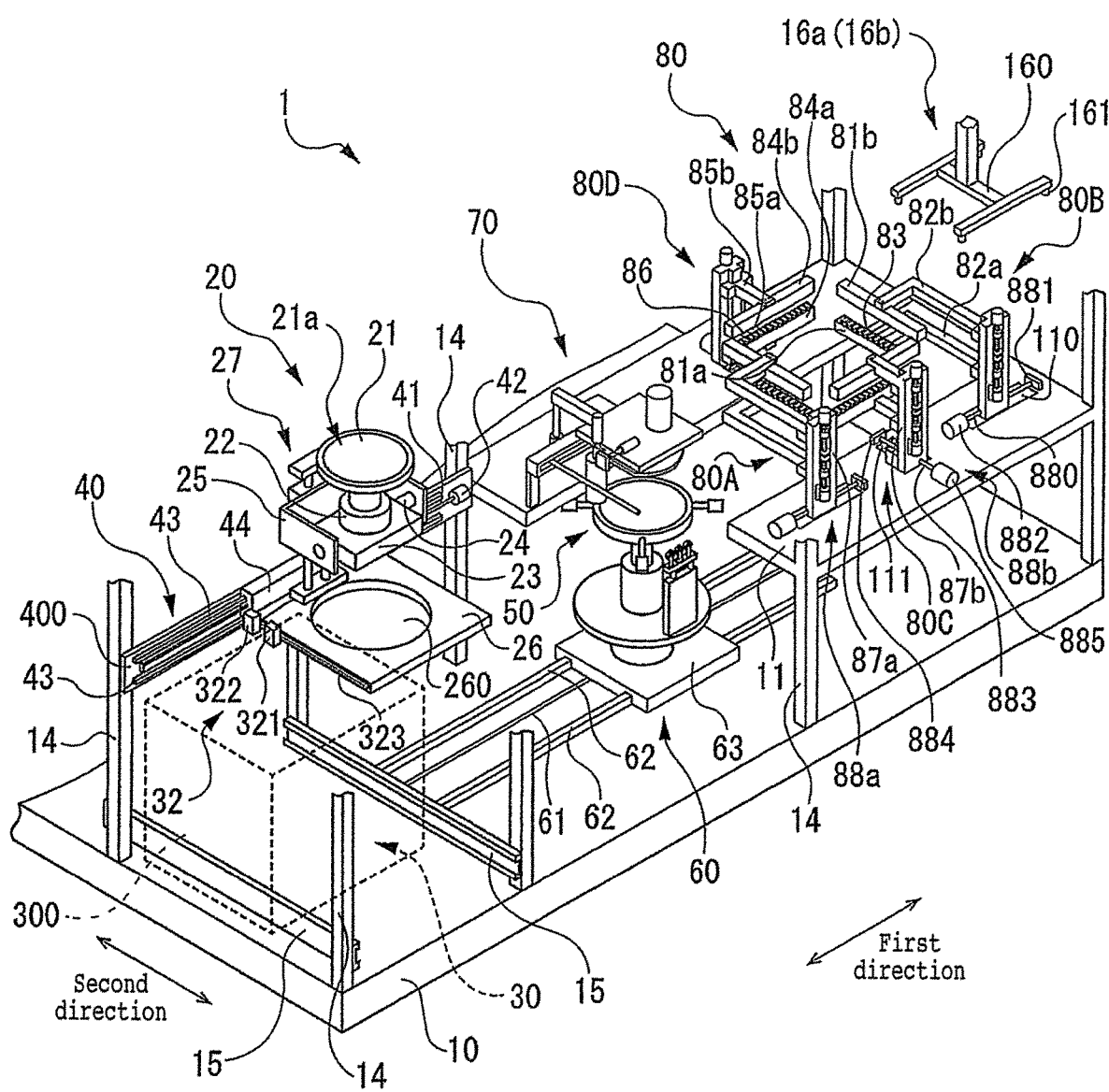
FIG. 1 is a perspective view depicting the configuration of part of a sheet expanding apparatus.

FIG. 1 schematically depicts the configuration of part of a sheet expanding apparatus 1 capable of clamping and pulling a sheet adhered to a plate-shaped body. The sheet expanding apparatus 1 includes a first apparatus base 10 extending in a first direction, and a second apparatus base 11 supported on an upper side of a rear portion, in regard of the first direction, of the first apparatus base 10 by a plurality of support columns 14. On the first apparatus base 10 are provided: a holding unit 20 having a holding surface 21a for holding the plate-shaped body; an adhering mechanism 30 which adheres a belt-shaped sheet to the plate-shaped body held by the holding unit 20 and cut the belt-shaped sheet to a rectangular sheet larger in size than the plate-shaped body; moving means 40 which moves an adhering roller of the adhering mechanism 30 relatively to the holding unit 20 in an adhering direction (in the example illustrated, the first direction) of adhering the belt-shaped sheet; a transfer unit 50 which receives the plate-shaped body being held by the holding unit 20 and having the rectangular sheet adhered thereto and transfers the plate-shaped body to an expanding mechanism 80 described later; transfer moving means 60 adapted to move the transfer unit 50 in the first direction; and a peeling mechanism 70 adapted to peel off a tape adhered to one surface of the plate-shaped body held by the transfer unit 50.

On the second apparatus base 11 is provided the expanding mechanism 80 including: first clamping means 80A and second clamping means 80B which are disposed oppositely on opposite sides, in regard of the first direction, of the plate-shaped body having the rectangular sheet adhered thereto and which clamp outer edges of the rectangular sheet adhered to the plate-shaped body by the adhering mechanism 30; third clamping means 80C and fourth clamping means 80D which are disposed oppositely on opposite sides, in regard of the second direction orthogonal to the first direction, of the plate-shaped body having the rectangular sheet adhered thereto and which clamp outer edges of the rectangular sheet; and clamping means moving means by which the first clamping means 80A and the second clamping means 80B can be moved for spacing away from each other in the first direction and by which the third clamping means 80C and the fourth clamping means 80D can be moved for spacing away from each other in the second direction.

Figure 2:
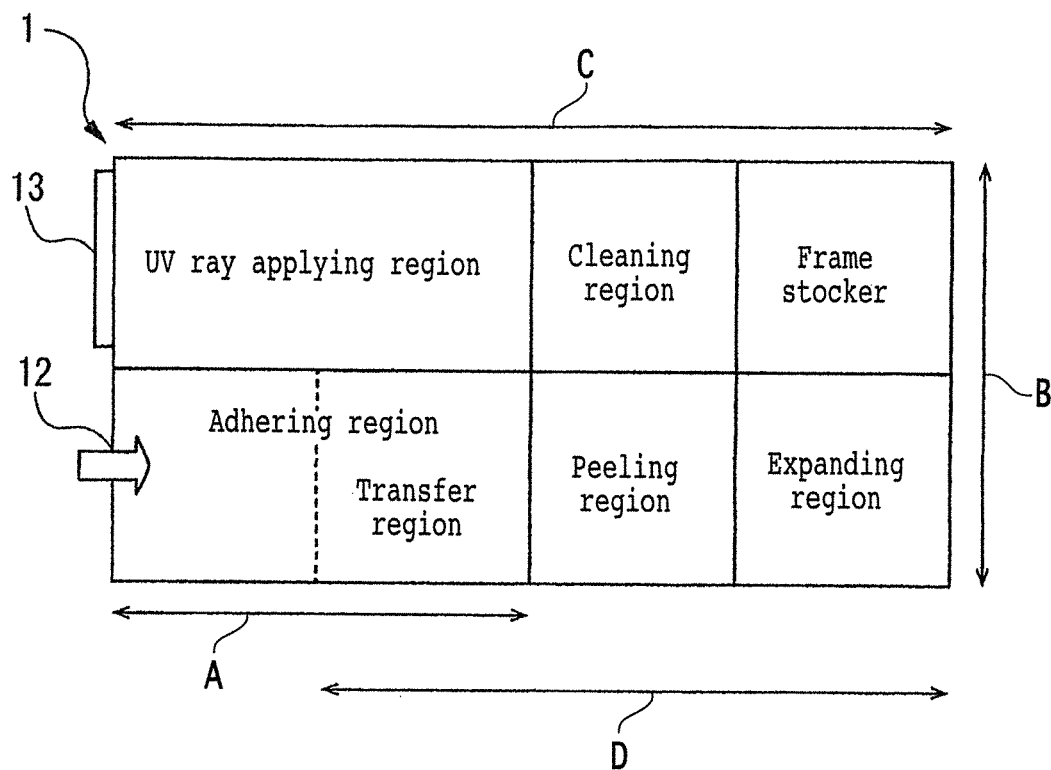
FIG. 2 is an illustration of a layout relation of mechanisms of the sheet expanding apparatus.

As illustrated in FIG. 2, the sheet expanding apparatus 1 has a carrying-in port 12 for carrying in the plate-shaped body therethrough. At a position adjacent to the carrying-in port 12 is provided combined display means and input means 13 inputting processing conditions and the like to the sheet expanding apparatus 1 and displaying the inputted contents and the like. The combined display means and input means 13 includes, for example, a touch panel. A region communicating with the carrying-in port 12 is an adhering region in which the rectangular sheet is adhered to the plate-shaped body by the adhering mechanism 30 depicted in FIG. 1. The adhering region includes a transfer region in which the plate-shaped body is transferred from the holding unit 20 to the transfer unit 50. In addition, a region adjacent to the transfer region is a peeling region in which the peeling mechanism 70 operates, and a region adjacent to the peeling region is an expanding region in which the expanding mechanism 80 operates. In FIG. 2, double arrow A shows moving region of the holding unit 20, double arrow B shows moving region of the first carrying means 16a, double arrow C shows the moving region of the second carrying means 16b and double arrow D shows moving region of the transfer unit 50.

Figure 3:
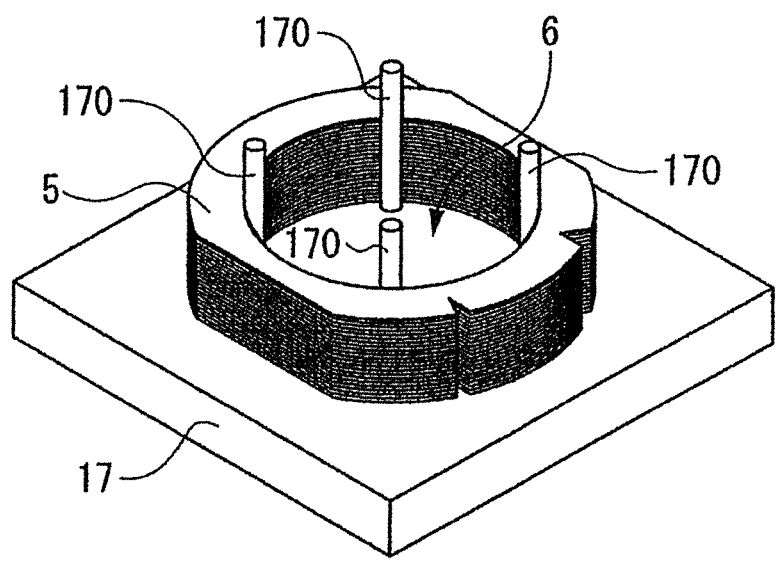
FIG. 3 is a perspective view depicting the configuration of an example of a frame stocker.
Figure 4:
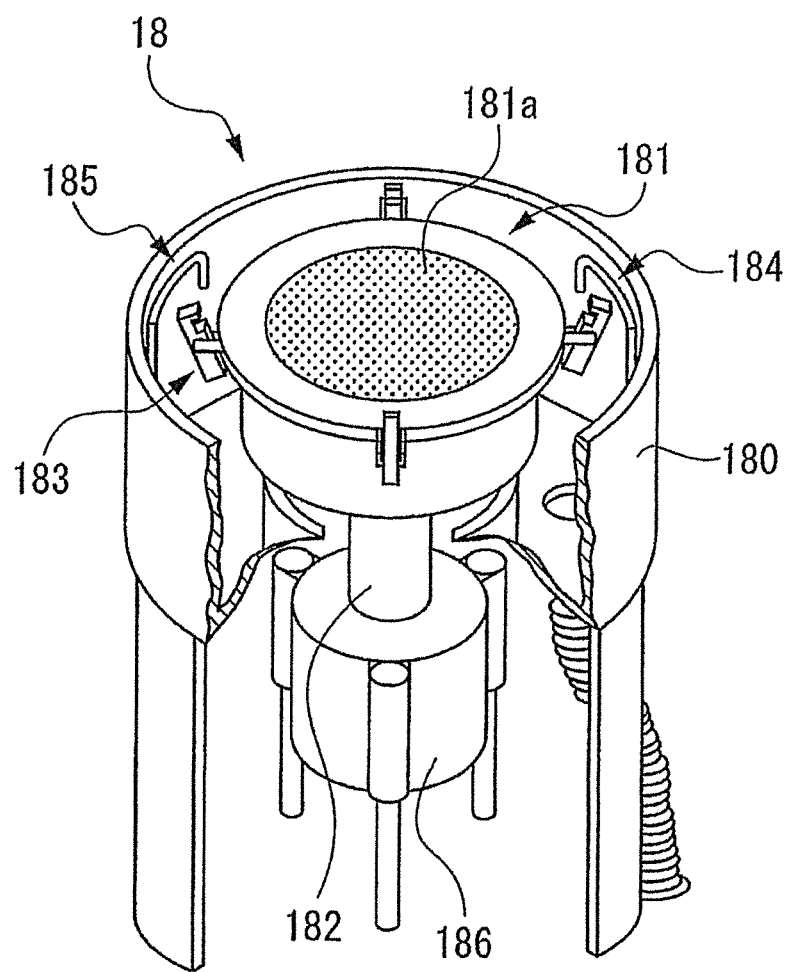
FIG. 4 is a perspective view depicting the configuration of an example of a cleaning apparatus.

The sheet expanding apparatus 1 includes: a frame stocker 17 depicted in FIG. 3 in which a plurality of frames 5 are accommodated; first carrying means 16a and second carrying means 16b (see FIG. 1) carrying the frame 5 to a predetermined destination of carrying; a cleaning apparatus 18 depicted in FIG. 4 cleaning the plate-shaped body expanded by the expanding mechanism 80; and an ultraviolet (UV) ray applying apparatus (not depicted) applying UV rays to the rectangular sheet expanded by the expanding mechanism 80. As depicted in FIG. 2, a region adjacent to the frame stocker 17 is a cleaning region in which the cleaning apparatus 18 operates, and a region adjacent to the cleaning region is a UV ray applying region in which the UV ray applying apparatus operates.

The configuration of the expanding mechanism 80 depicted in FIG. 1 will be described. The first clamping means 80A and the second clamping means 80B respectively include: a rectangular parallelepiped lower-side clamping section 81a extending in the second direction; a sectionally substantially L-shaped arm section 82a having its one end connected to the lower-side clamping section 81a; an upper-side clamping section 81b extending in parallel to the lower-side clamping section 81a; a sectionally substantially L-shaped arm section 82b having its one end connected to the upper-side clamping section 81b; and a movable base 87a disposed to be movable along a recess 110 formed in an upper surface of the second apparatus base 11. On an upper surface side of the lower-side clamping section 81a, a plurality of rollers 83 are disposed in the state of being aligned in the direction parallel to the second direction. The plurality of rollers 83 are rotatable around a rotational axis parallel to the first direction, and are each mounted in a state in which about one half of an outer peripheral surface thereof is projected from the upper surface of the lower-side clamping section 81a. In addition, on a lower surface side of the upper-side clamping section 81b of the first clamping means 80A and the second clamping means 80B, a plurality of rollers (not depicted) are disposed in the state of being aligned in the direction parallel to the second direction. The plurality of rollers disposed on the lower surface side of the upper-side clamping section 81b are rotatable around a rotational axis parallel to the first direction, and are each mounted in a state in which about one half of an outer peripheral surface thereof is projected from the lower surface of the upper-side clamping section 81b.

The third clamping means 80C and the fourth clamping means 80D respectively include: a rectangular parallelepiped lower-side clamping section 84a extending in the first direction; an arm section 85a having its one end connected to the lower-side clamping section 84a; an upper-side clamping section 84b extending in parallel to the lower-side clamping section 84a; an arm section 85b having its one end connected to the upper-side clamping section 84b; and a movable base 87b disposed to be movable along a recess 111 formed in the upper surface of the second apparatus base 11. On an upper surface side of the lower-side clamping section 84a, a plurality of rollers 86 are disposed in the state of being aligned in the direction parallel to the first direction. The plurality of rollers 86 are rotatable around a rotational axis parallel to the second direction, and are each mounted in a state in which about one half of an outer peripheral surface thereof is projected from the upper surface of the lower-side clamping section 84a. In addition, on a lower surface side of the upper-side clamping section 84b of the third clamping means 80C and the fourth clamping means 80D, a plurality of rollers (not depicted) are disposed in the state of being aligned in the direction parallel to the first direction. The plurality of rollers disposed on the lower surface side of the upper-side clamping section 84b are rotatable around a rotational axis parallel to the second direction, and are each mounted in a state in which about one half of an outer peripheral surface thereof is projected from the lower surface of the upper-side clamping section 84b.

The clamping means moving means includes first direction moving means 88a connected respectively to the first clamping means 80A and the second clamping means 80B, and second direction moving means 88b connected respectively to the third clamping means 80C and the fourth clamping means 80D. The first direction moving means 88a include ball screws 880 extending in the first direction, bearing sections 881 supporting one-side ends of the respective ball screws 880 in a rotatable manner, and motors 882 connected to other-side ends of the respective ball screws 880, and they are disposed respectively on the second apparatus base 11. The first direction moving means 88a can move the first clamping means 80A and the second clamping means 80B for spacing away from each other in the first direction. The second direction moving means 88b include ball screws 883 extending in the second direction, bearing sections 884 supporting one-side ends of the respective ball screws 883 in a rotatable manner, and motors 885 connected to other-side ends of the respective ball screws 883, and they are disposed on the second apparatus base 11. The second direction moving means 88b can move the third clamping means 80C and the fourth clamping means 80D spacing away from each other in the second direction.

The first carrying means 16a and the second carrying means 16b include at least a substantially H-shaped carrying plate 160, and a plurality of (in the example illustrate, four) frame holding sections 161 adapted to suction hold a one-side surface of a frame disposed at a lower end corner portion of the carrying plate 160. As depicted in FIG. 2, the first carrying means 16a described in the present embodiment has a region between the expanding region and the frame stocker 17 as its moving region. In addition, the second carrying means 16b has a region ranging from the frame stocker 17 to the UV ray applying region as its moving region.

As illustrated in FIG. 3, the frame stocker 17 is an example of a frame stocker by which the ring-shaped frames each having an opening 6 in the center thereof are stocked in a stacked state. The frame stocker 17 includes a plurality of cylindrical members 170, which make contact with inner peripheral surfaces of the frames 5, at substantially regular intervals. While the number of the cylindrical members 170 is four in the illustrated example, this number is not limitative. Note that the material of the frame 5 includes, for example, a metal such as stainless steel.

As illustrated in FIG. 4, the cleaning apparatus 18 has a tubular cover member 180, and includes, on the inside of the cover member 180: a spinner table 181 having a holding surface 181a adapted to hold the plate-shaped body; a rotary shaft 182 adapted to rotate the spinner table 181; a plurality of (in the illustrated example, four) clamp mechanisms 183 adapted to fix the frame 5, depicted in FIG. 3, on the outer periphery side of the spinner table 181; a cleaning water nozzle 184 through which to supply cleaning water to the plate-shaped body; an air nozzle 185 for drying the plate-shaped body after cleaning; and a lift mechanism 186 including air cylinders and pistons for lifting the spinner table 181 up and down in the vertical direction.

Figure 5A:
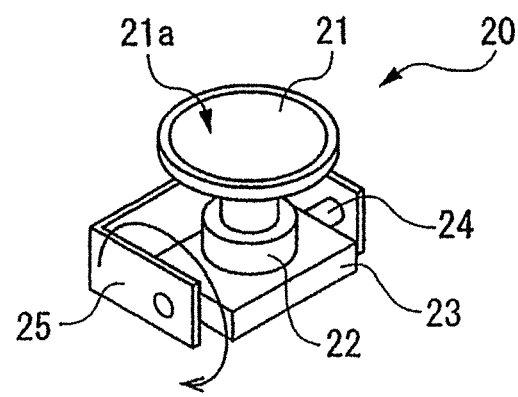
FIGS. 5A to 5C are perspective views depicting the configuration of a holding unit.
Figure 5B:
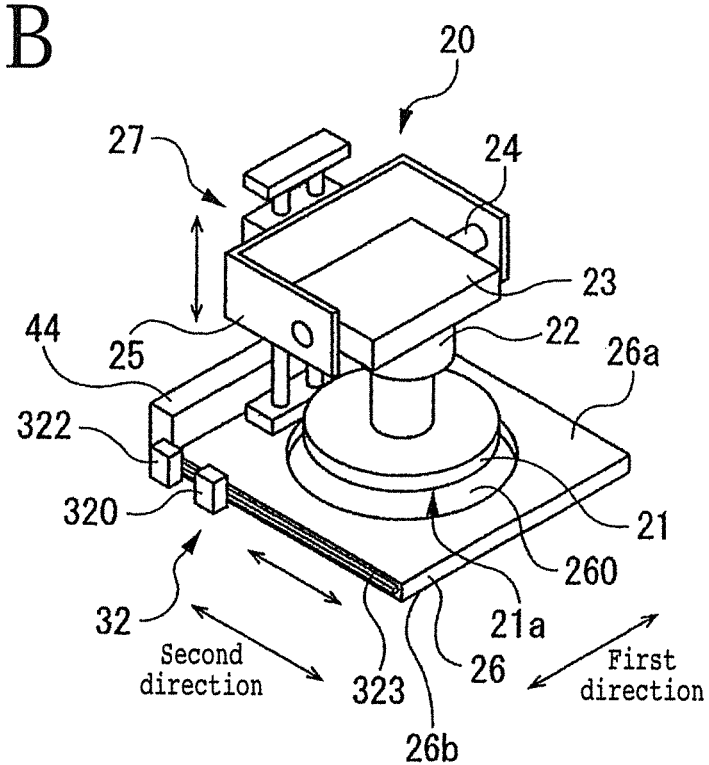

As depicted in FIG. 5A, the holding unit 20 includes: a plate-shaped body holding section 21 which includes a holding surface 21a and holds the plate-shaped body; a fixed base 22 fixed to a lower portion of the plate-shaped body holding section 21; a base 23 that supports the plate-shaped body holding section 21 and the fixed base 22 from below; a rotary shaft 24 which is passed through the base 23 and inverts the holding surface 21a of the plate-shaped body holding section 21; and a gate-formed support section 25 on which end portions of the rotary shaft 24 are rotatably supported. As illustrated in FIG. 5B, a lift mechanism 27 including, for example, an air cylinder and a piston is connected to the support section 25, whereby the holding unit 20 as a whole can be lifted up and down in the vertical direction.

The holding unit 20 includes a rectangular plate-shaped sheet adhesion plate 26 on a lower side of the plate-shaped body holding section 21. The sheet adhesion plate 26 has in its center a circular opening 260 that penetrates upper and lower surfaces (an upper surface 26a and a lower surface 26b). The opening 260 is greater than the plate-shaped holding section 21 in diameter. When the rotary shaft 24 of the support section 25 is rotated to invert the holding surface 21a of the plate-shaped body holding section 21, the holding surface 21a and the opening 260 can be made to face each other. In this state, with the plate-shaped body holding section 21 lowered by the lift mechanism 27, the plate-shaped body holding section 21 can be made to enter the opening 260.

Figure 5C:
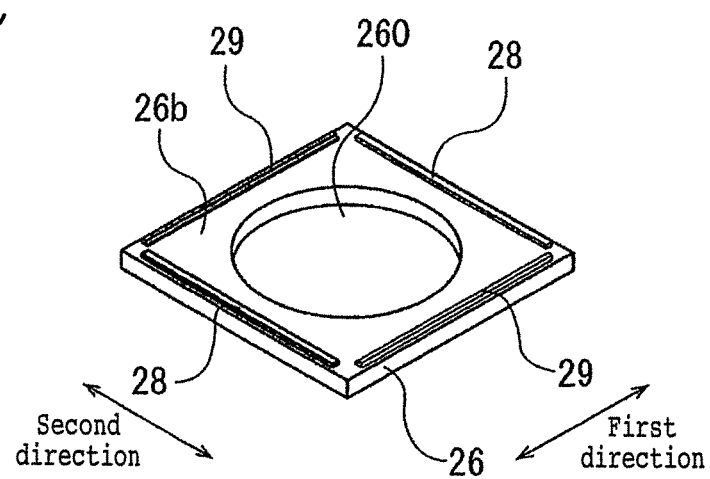

As depicted in FIG. 5C, on the lower surface 26b of the sheet adhesion plate 26, there are further provided sheet adhered sections 28 which are disposed on an adhesion starting side and an adhesion finishing side on opposite sides of the holding surface 21a in regard of an adhering direction (in the illustrated example, the first direction) in the periphery of the plate-shaped body holding section 21 and which are projected as compared to a sheet adhered surface of the plate-shaped body held by the holding surface 21a, and roller guides 29 extending in the first direction orthogonal to the sheet adhered sections 28 on opposite sides of the holding surface 21a of the plate-shaped body holding section 21. The sheet adhered section 28 described in the present embodiment includes, for example, a bar-shaped member. The sheet adhered sections 28 are oriented in parallel to the second direction, and are disposed oppositely on outer edge sides in regard of the first direction on opposite sides of the opening 260. With a belt-shaped sheet adhered in the manner of laying over the two sheet adhered sections 28 and with the belt-shaped sheet adhered to the plate-shaped body held by the holding surface 21a that is exposed from the opening 260, wrinkling of the belt-shaped sheet can be prevented. The roller guide 29 is formed, for example, to be substantially L-shaped in section. The roller guides 29 are oriented in parallel to the first direction, and are disposed oppositely on outer edge sides in regard of the second direction on opposite sides of the opening 260.

The moving means 40 illustrated in FIG. 1 includes: a ball screw 41 disposed on a support plate 400 extending in the first direction; a motor 42 connected to one end of the ball screw 41; a pair of guide rails 43 extending in parallel to the ball screw 41; and a moving base 44 movable horizontally in the first direction. The sheet adhesion plate 26 is connected to a one-side surface of the moving base 44. The pair of guide rails 43 make sliding contact with an other-side surface of the moving base 44, and the ball screw 41 is in screw engagement with a nut formed in the center of the moving base 44. With the ball screw 41 driven by the motor 42 to rotate, the holding unit 20 can be moved in the first direction along the guide rails 43, together with the moving base 44. By the moving means 40, the holding unit 20 can be moved within the adhering region depicted in FIG. 2.

The adhering mechanism 30 has a unit main body 300 indicated by dotted line in FIG. 1. The unit main body 300 is located on the lower side of the holding unit 20, and is disposed to face the plate-shaped body held by the holding unit 20. Mechanisms of the adhering mechanism 30 are accommodated in the unit main body 300. In the example illustrated, the unit main body 300 can be slidingly moved along a pair of guides 15 which are disposed at a front portion in regard of the first direction of the first apparatus base 10 and which extend in the second direction. This ensures that at the time of maintenance of the adhering mechanism 30 or an operation of replacing each mechanism, at the time of supplying the belt-shaped sheet wound in a roll form or in similar occasions, the unit main body 300 can be drawn out to the outside of the sheet expanding apparatus 1, and the unit main body 300 can be disposed in the adhering region of the sheet adhering apparatus 1 after completion of the operation.

Figure 6:
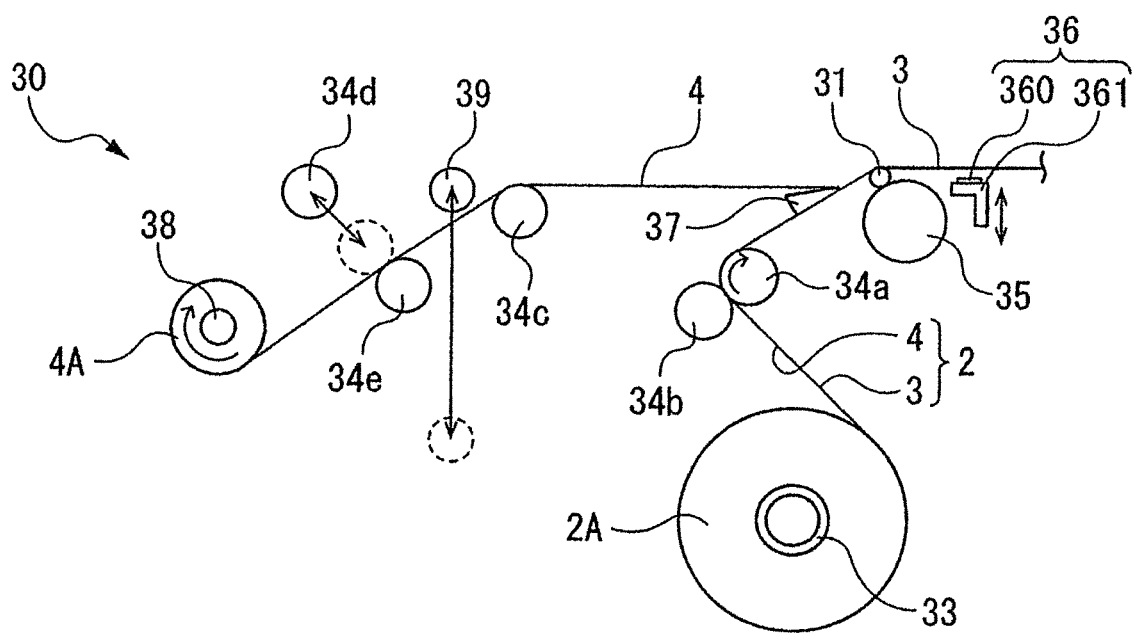
FIG. 6 is a side view depicting the configuration of an adhering mechanism.
Figure 7:
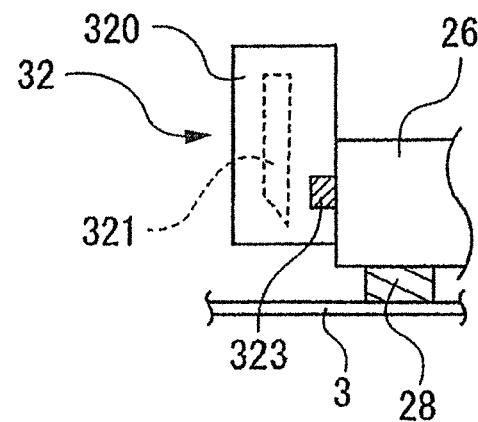
FIG. 7 is a partial enlarged sectional view depicting the configuration of a cutter.

As depicted in FIG. 6, the adhering mechanism 30 includes: a reel 33; an adhering roller 31 by which the belt-shaped sheet 2 wound in a roll form (sheet roll 2A) on the reel 33 is adhered to the plate-shaped body held by the holding unit 20 depicted in FIGS. 5A to 5C; a cutter 32 depicted in FIG. 7 by which the belt-shaped sheet 2 is cut out to a rectangular sheet larger in size than the plate-shaped body; a let-off roller 34a as a letting-off section which is disposed on the upper side of the reel 33 and lets off the belt-shaped sheet 2; a clamping roller 34b disposed to face the let-off roller 34a; a flexure preventing roller 35 disposed to face the adhering roller 31; and sheet adhering means 36 adhering one end of the belt-shaped sheet 2 let off by the let-off roller 34a to the sheet adhered section 28 on the adhesion starting side.

The belt-shaped sheet 2 described in the present embodiment includes a sheet main body 3, which includes at least a base sheet and a glue layer disposed on the base sheet, and a belt-shaped release film 4 disposed on the glue layer of the sheet main body 3. The belt-shaped sheet 2 is wound in a roll form on the reel 33. The base sheet is formed, for example, from polyolefin or polyvinyl chloride. Though not illustrated, the adhering roller 31 includes a tubular roller extending in a horizontal direction while having a length not smaller than the diameter of the plate-shaped body (for example, a circular disk-shaped wafer). The position of the adhering roller 31 is fixed, and when the sheet adhesion plate 26 of the holding unit 20 as above-mentioned is moved in the first direction, the adhering roller 31 is guided along the roller guides 29 and the sheet main body 3 can be pressed against the plate-shaped body from below, in a state in which both ends of the adhering roller 31 are fitted to the pair of roller guides 29. Note that the adhering roller 31 is not particularly limited as to material or the like, and is formed of, for example, silicone rubber.

The let-off roller 34a is driven by, for example, a servo motor to rotate, and the let-off amount of the belt-shaped sheet 2 from the sheet roll 2A can be controlled by torque control. The clamping roller 34b can prevent the sheet main body 3 adhered to the plate-shaped body from slackening, by pressing the belt-shaped sheet 2 drawn out from the sheet roll 2A against the let-off roller 34a and clamping the belt-shaped sheet 2 between itself and the let-off roller 34a.

The flexure preventing roller 35 has a diameter greater than the diameter of the adhering roller 31, and is disposed adjacently to the adhering roller 31. The flexure preventing roller 35 can press the adhering roller 31 in a rollable manner in a state in which a peripheral surface of the flexure roller 35 is in contact with a peripheral surface of the adhering roller 31. This ensures that the sheet main body 3 can be prevented from flexure when the adhering roller 31 presses the sheet main body 3 against the plate-shaped body. Note that the flexure preventing roller 35 may not necessarily be provided.

The sheet adhering means 36 includes a cushion 360 and a moving section 361 which moves in the vertical direction. While the material of the cushion 360 is not particularly limited, it is formed of, for example, an elastic material such as silicone rubber, like the adhering roller 31. The sheet adhering means 36, with the moving section 361 moving upward, can push up the sheet main body 3 from below by the cushion 360, thereby adhering the sheet main body 3 to the sheet adhered sections 28 depicted in FIG. 5C.

In addition, the adhering mechanism 30, for making the tape tension constant, includes: a peel plate 37 adapted to peel off the belt-shaped release film 4 from the belt-shaped sheet 2 let off by the let-off roller 34a; a take-up roller 38 as a take-up section that takes up the peeled belt-shaped release film 4; a guide roller 34c disposed between the peel plate 37 and the take-up roller 38; a movable roller 34d; a presser roller 34e disposed to face the movable roller 34d; and a weight 39 adapted to press down the belt-shaped release film 4 between the peel plate 37 and the take-up roller 38.

The peel plate 37 has a sharpened tip shape, and, by pressing the belt-shaped sheet 2 to form an acute angle, can peel off the belt-shaped release film 4 from the belt-shaped sheet 2. The peeled belt-shaped release film 4 is passed through the guide roller 34c and through the gap between the movable roller 34d and the presser roller 34e, to be taken up by the take-up roller 38, forming a release film roll 4A. While the belt-shaped release film 4 is peeled off from the belt-shaped sheet 2 by the peel plate 37 and the sheet main body 3 is adhered to the plate-shaped body, the movable roller 34d and the presser roller 34e press the belt-shaped release film 4, to thereby pull the belt-shaped release film 4, whereby the sheet main body 3 adhered to the plate-shaped body can be prevented from getting twisted. The take-up roller 38 is driven by, for example, a servo motor to rotate.

The weight 39 illustrated in the present embodiment is a roller for pressing down the belt-shaped release film 4 peeled off from the belt-shaped sheet 2 by the peel plate 37, and is disposed between the guide roller 34c and the presser roller 34e. When the release film roll 4A taken up on the take-up roller 38 becomes larger in diameter, the torque varies; in this case, notwithstanding a variation in the torque, a constant tension can be applied to the belt-shaped release film 4 by pressing down the belt-shaped release film 4 by the weight 39, while the sheet main body 3 is adhered to the plate-shaped body and, simultaneously, the belt-shaped release film 4 is taken up by the take-up roller 38. In addition, while the belt-shaped release film 4 is pressed down by the weight 39, the belt-shaped release film 4 is pressed by the movable roller 34d and the presser roller 34e, for preventing the take-up roller 38 from being pulled toward the weight 39 side. Note that the weight, material and the like of the weight 39 are not particularly limited.

As illustrated in FIG. 7, the cutter 32 is disposed at a lateral side of the sheet adhesion plate 26 on the adhesion finishing side. The cutter 32 includes a cutter accommodating section 320, and a cutter blade 321 (depicted by dotted line) accommodated inside the cutter accommodating section 320. The cutter accommodating section 320 is formed in a lower portion thereof with an opening through which the cutter blade 321 can advance and retreat. As depicted in FIG. 5B, the cutter accommodating section 320 is movable in the second direction along a guide rail 323 disposed at a lateral side of the sheet adhesion plate 26. According to the cutter 32 configured in this way, the belt-shaped sheet main body 3 can be formed into a rectangular sheet by cutting out the sheet main body 3 which is adhered to the sheet adhered section 28 on the adhesion finishing side and is located on the lower side of the cutter 32. In the present embodiment, a cutter heater 322 is fixed to one end of the guide rail 323. It is recommendable that, until the sheet main body 3 is practically cut by the cutter blade 321, the cutter heater 322 is kept in contact with the cutter accommodating section 320 to heat the cutter blade 321.

Figure 8:
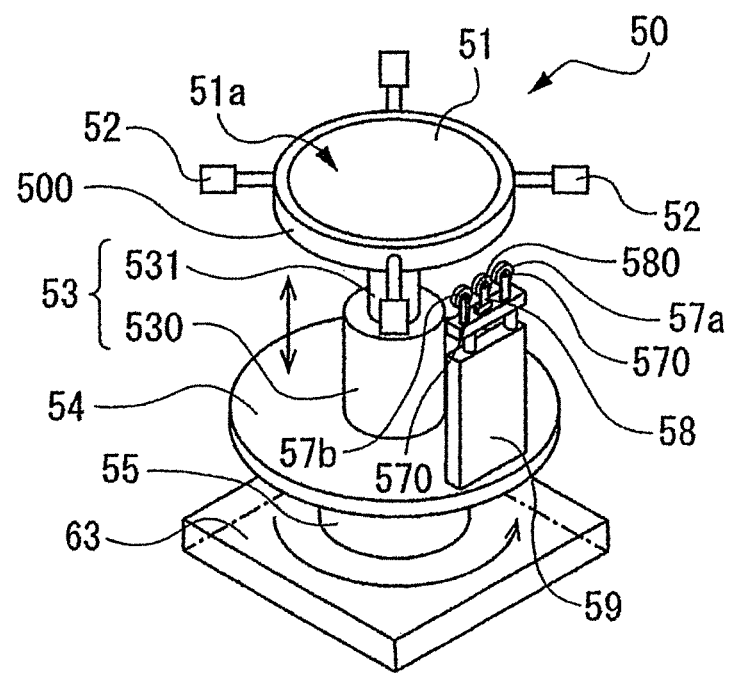
FIG. 8 is a perspective view depicting the configuration of a transfer unit.

As illustrated in FIG. 8, the transfer unit 50 includes: a transfer unit holding section 51 adapted to hold the plate-shaped body held by the holding unit 20 and having the rectangular sheet adhered thereto, through the rectangular sheet; and corner portion clamping means 52 for respectively clamping corner portions of the rectangular sheet in the periphery of the transfer unit holding section 51. The transfer unit holding section 51 is disposed on a circular disk 54 through a lift mechanism 53. The lift mechanism 53 includes an air cylinder 530 and a piston 531, and can lift the transfer unit holding section 51 up and down.

Frame adhering rollers 57a and 57b and a frame adhesion cutter 58 are disposed at positions in the vicinity of the transfer unit holding section 51. The frame adhering rollers 57a and 57b are presser rollers for pressing the rectangular sheet 7 against the frame 5 depicted in FIG. 3, and can each be rotated around a shaft section 570. For example, heaters are incorporated in the frame adhering rollers 57a and 57b. The frame adhesion cutter 58 is disposed between the frame adhering rollers 57a and 57b. The frame adhesion cutter 58 can be rotated around a shaft section 580. The frame adhering rollers 57a and 57b and the frame adhesion cutter 58 are disposed over the circular disk 54, which can be rotated by a rotary shaft 55, through an erected section 59. The frame adhering rollers 57a and 57b and the frame adhesion cutter 58 can be lifted up and down, at the upper end of the erected section 59, by a lift mechanism including an air cylinder and a piston, for example. With the circular disk 54 rotated, the frame adhering rollers 57a and 57b and the frame adhesion cutter 58 can be turned around circularly along the frame 5, for example. Note that the numbers of the frame adhering rollers 57a and 57b and the frame adhesion cutter 58 are not limited to those described in the present embodiment.

Figure 9:
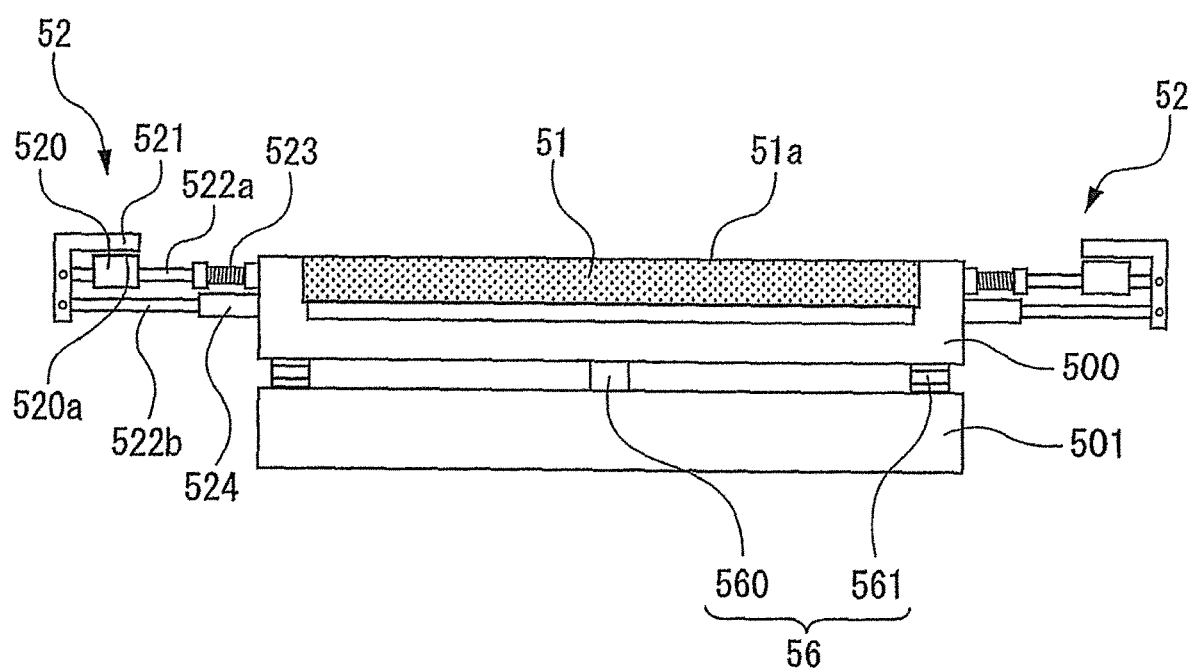
FIG. 9 is a sectional view depicting the configuration of the transfer unit.

As illustrated in FIG. 9, the transfer unit holding section 51 is a circular disk-shaped porous member fitted inside a frame body 500, and its upper surface is a holding surface 51a for holding the plate-shaped body. The frame body 500 is supported by a base 501. A suction source (not depicted) is connected to the transfer unit holding section 51, and the plate-shaped body can be suction held by the holding surface 51a. An inclination adjusting mechanism 56 is disposed between the frame body 500 and the base 501. The inclination adjusting mechanism 56 includes a cylinder 560 and a spring 561. The spring 561 includes a compression spring, for example. An expansion/contraction operation of the spring 561 permits the frame body 500 to oscillate relative to the base 501, whereby a shock at the time of transferring the plate-shaped body onto the holding surface 51a, for example, can be absorbed.

Figure 10A:
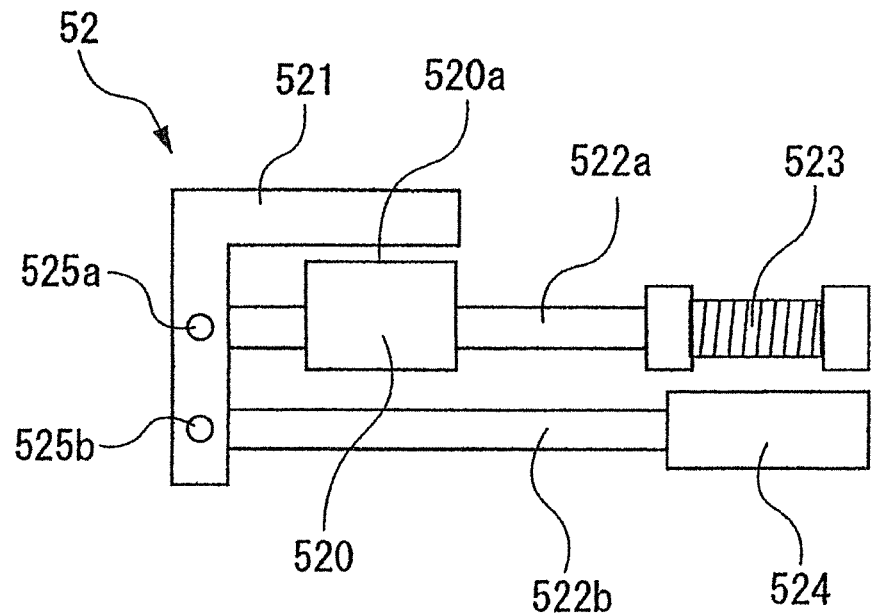
FIGS. 10A and 10B are sectional views depicting the configuration of corner portion clamping means.
Figure 10B:
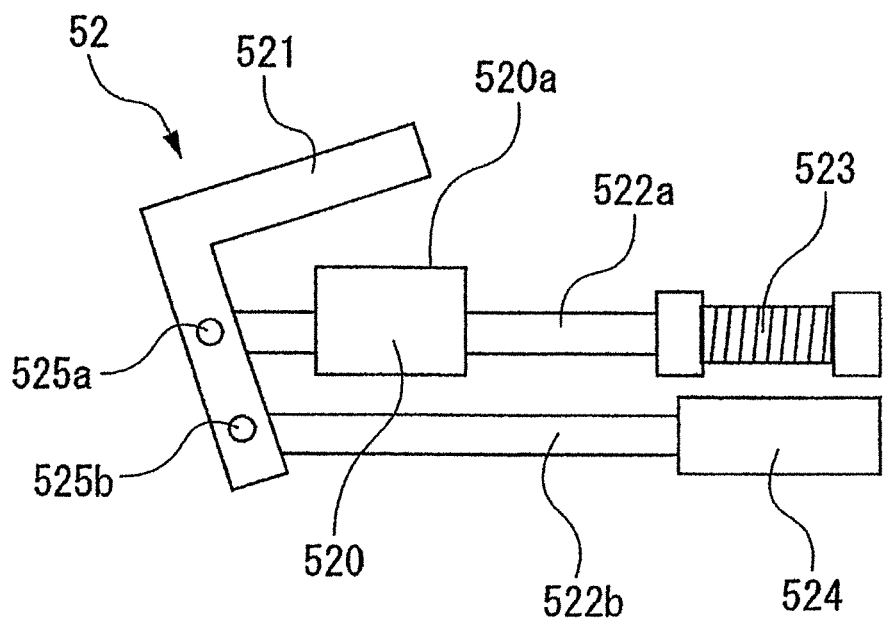

Four corner portion clamping means 52, for example, are disposed at regular intervals in the periphery of the transfer unit holding section 51. As depicted in FIG. 10A, the corner portion clamping means 52 described in the present embodiment includes: a sheet corner portion mounting section 520 having a mounting surface 520a on which a corner portion of the rectangular sheet 7 is mounted; a clamp section 521 adapted to clamp the corner portion of the rectangular sheet mounted on the sheet corner portion mounting section 520; and an opening/closing mechanism adapted to open and close the clamp section 521. The opening/closing mechanism includes piston rods 522a and 522b, a spring 523 connected to a one-side end of the piston rod 522a, a cylinder 524 connected to a one-side end of the piston rod 522b, and shaft sections 525a and 525b serving as fulcrums at other-side ends of the piston rods 522a and 522b. An upper portion side of the clamp section 521 is biased by the spring 523 in a direction for approaching the mounting surface 520a. In the case of opening the clamp section 521, as depicted in FIG. 10B, the piston rod 522b is moved toward an inner side in the cylinder 524, whereby the clamp section 521 can be rotated with the shaft sections 525a and 525b as fulcrums, and the clamp section 521 can be opened in a direction for spacing away from the mounting surface 520a.

The transfer unit 50 can be moved, by the transfer moving means 60 depicted in FIG. 1, between the transfer region, the peeling region and the expanding region which are depicted in FIG. 2. The transfer moving means 60 includes a ball screw 61 extending in the first direction, a motor (not depicted) connected to one end of the ball screw 61, a pair of guide rails 62 laid on the first apparatus base 10 to extend in parallel to the ball screw 61, and a moving base 63 adapted to support the transfer unit 50 on a one-side surface thereof. The pair of guide rails 62 are in sliding contact with an other-side surface of the moving base 63, and the ball screw 61 is in screw engagement with a nut formed in the center of the moving base 63. With the ball screw 61 driven by the motor to rotate, the transfer unit 50 can be moved in the first direction along the guide rails 62 together with the moving base 63.

The peeling mechanism 70 is disposed on an upper surface of the second apparatus base 11 and on the upper side of the transfer unit 50. The peeling mechanism 70 is a tape peeling unit configured to peel off a tape (for example, a surface protective tape) adhered to a surface of the plate-shaped body. The peeling mechanism 70 includes: a tape holding unit 70A depicted in FIG. 11A which clamps the tape; bending roller moving means 70B depicted in 11B for bending the tape to be peeled off from the plate-shaped body; and peeling start point portion forming means 70C depicted in FIG. 11C for forming a peeling start point for the tape to be peeled off from the plate-shaped body.

Figure 11A:
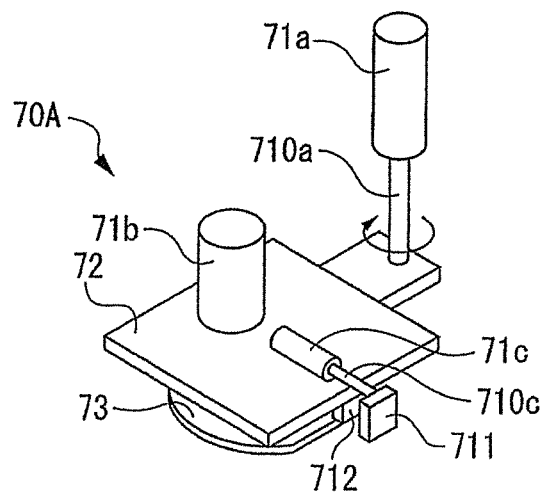
FIGS. 11A to 11C are perspective views depicting the configuration of a peeing mechanism.

As illustrated in FIG. 11A, the tape holding unit 70A includes: a first air cylinder 71a; a holding base 72 supported by a shaft 710a which is driven by the first air cylinder 71a and extends in the vertical direction; a second air cylinder 71b erected on an upper surface of the holding base 72; a holding plate 73 supported by a shaft (not depicted) which penetrates from the second air cylinder 71b to the lower surface side of the holding base 72 and is capable of advancing and retreating by being driven by the second air cylinder 71b; a third air cylinder 71c disposed on the holding base 72 and causing a shaft 710c, which has a clamping piece 711 at an end portion thereof and is capable of advancing and retreating in a horizontal direction, to advance and retreat in the horizontal direction; and a clamping piece 712 disposed at a position for facing the clamping piece 711 on the lower surface side of the holding base 72.

The holding plate 73 is hollow inside, is provided in the whole lower surface thereof with minute holes (not depicted), can apply suction to the inside of the holding plate 73 through the inside of a shaft connecting the second air cylinder 71*b* and the holding plate 73, and can generate a negative pressure at the lower surface of the holding plate 73 through the minute holes.

The holding base 72 can be moved up and down together with the shaft 710*a* driven by the first air cylinder 71*a* to be able to advance and retreat, and, further, is rotatable horizontally around the shaft 710*a*, as indicated by an arrow in the figure.

Figure 11B:
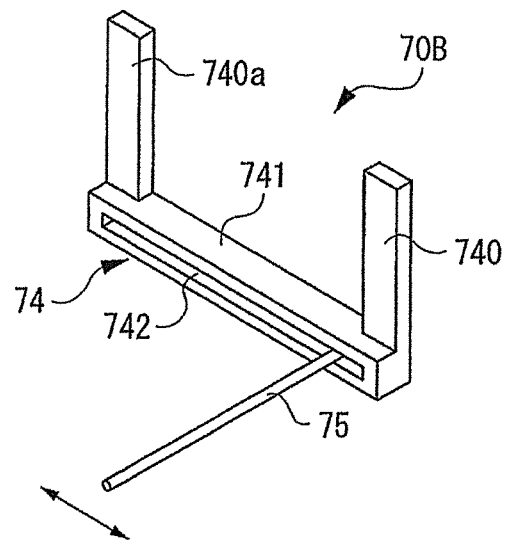

As depicted in FIG. 11B, the bending roller moving means 70B includes a gate-formed support frame 74. The support frame 74 includes: column sections 740 and 740*a* arranged with a spacing therebetween; a support section 741 connected to lower ends of the column sections 740 and 740*a*; and a bending roller 75 moved along a guide hole 742 in the support section 741 by a driving mechanism (not depicted) incorporated in the support section 741. The bending roller 75 is rotatable around a longitudinal center axis thereof, and its length is at least longer than the diameter of the tape to be adhered to the plate-shaped body.

Figure 11C:
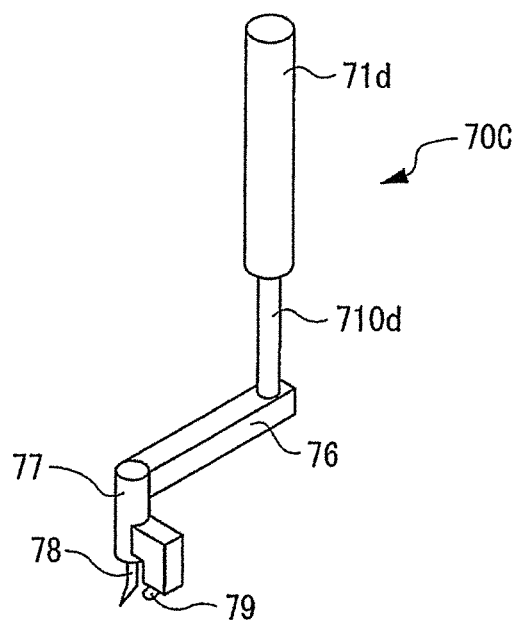

As illustrated in FIG. 11C, the peeling start point portion forming means 70C includes: a fourth air cylinder 71*d*; a shaft 710*d* which extends from the four air cylinder 71*d*, is capable of advancing and retreating, and the height directional position of which can be finely adjusted; an arm member 76; a tip member 77 provided at a tip of the arm member 76; a tip needle-shaped member 78 attached to the tip member 77; and an air nozzle 79. The tip member 77 is vertically movable, and, with the height position of the tip member 77 adjusted, a tip portion of the tip needle-shaped member 78 can be positioned at the height of the surface protective tape adhered to the plate-shaped body. In addition, the air nozzle 79 is supplied with high-pressure air through the fourth air cylinder 71*d* and the shaft 710*d*, and can jet the high-pressure air as required. While the tip needle-shaped member 78 and the air nozzle 79 are provided separately in the example illustrated, a configuration may be adopted in which the air nozzle 79 is incorporated in the tip needle-shaped member 78, and high-pressure air is jetted from the tip of the tip needle-shaped member 78.

Figure 12:
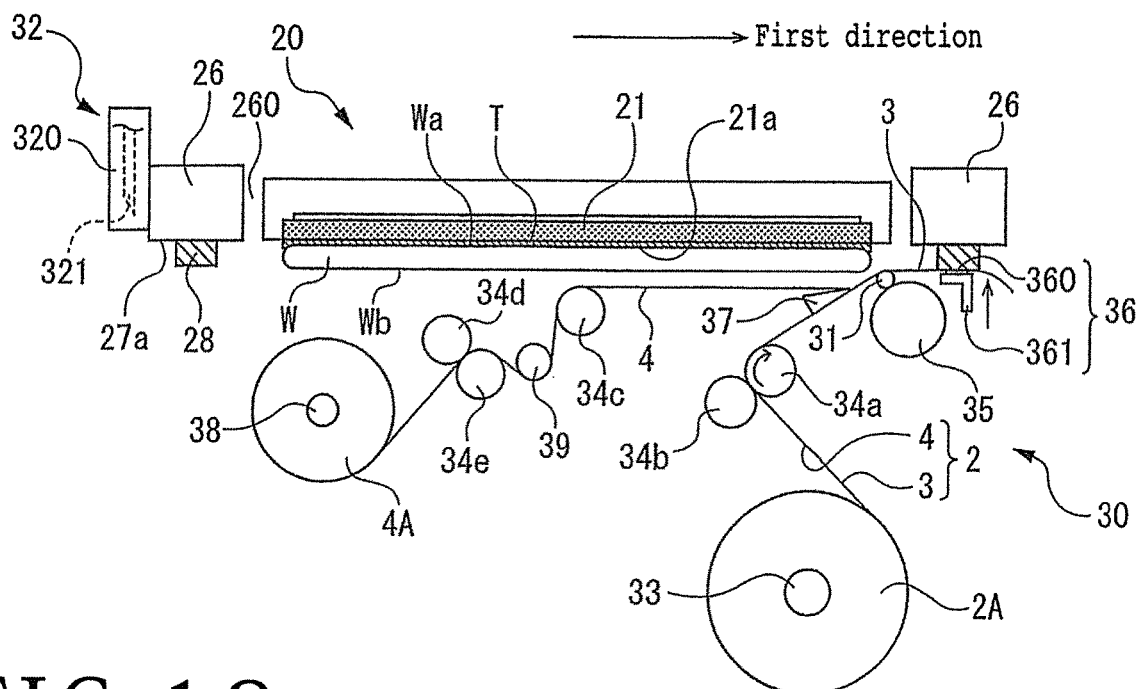
FIG. 12 is a sectional view depicting a state in which a base sheet is adhered to a sheet adhered section on an adhesion starting side in an adhering mechanism.

An operation example of the sheet expanding apparatus 1 will be described below. A plate-shaped body W depicted in FIG. 12 is an example of a circular disk-shaped workpiece. A tape T for protecting devices is adhered to a front surface Wa of the plate-shaped body W. A back surface Wb opposite to the front surface Wa is a sheet adhered surface to which the sheet main body 3 (rectangular sheet) is to be adhered. The plate-shaped body W described in the present embodiment is assumed to be one in the inside of which modified layers have been formed along division lines (streets) by application of a laser beam, which has been thinned by a grinding apparatus, for example, and which has been divided into individual chips with the modified layers as start points of division. The plate-shaped body W may be in a state of having been formed therein with the modified layers along the division lines but not having been divided into the individual chips. In addition, the plate-shaped body W may be one which has been formed with cut grooves along division lines by a cutting blade or the like and has thereafter been divided into individual chips. Further, the plate-shaped body W may be one which has been divided, and to which a die attach film (DAF) has been adhered, the die attach film being to be divided by the sheet expanding apparatus 1.

When the front surface Wa side of the plate-shaped body W is held by the holding surface 21*a* of the holding unit 20, the holding unit 20 is moved to the upper side of the adhering mechanism 30 by the moving means 40 depicted in FIG. 1. After the rotary shaft 24 depicted in FIG. 5B rotates to invert the holding surface 21*a* of the plate-shaped body holding section 21, thereby exposing the back surface Wb of the plate-shaped body W to the lower side, and the plate-shaped body W held by the holding surface 21*a* is faced to the opening 260 of the sheet adhesion plate 26, the plate-shaped body holding section 21 is lowered by the lift mechanism 27, the plate-shaped body holding section 21 is made to enter the opening 260, and the plate-shaped body W is positioned inside the sheet adhered section 28. In addition, the plate-shaped body W may be positioned in such a manner that the back surface Wb of the plate-shaped body W is slightly above that surface of the sheet adhered section 28 to which the sheet main body 3 is to be adhered, after the plate-shaped body holding section 21 is inverted. Note that the holding unit 20 may be moved to a desired position (the position on the upper side of the adhering mechanism 30) without inverting the plate-shaped body holding section 21, and thereafter the plate-shaped body holding section 21 may be inverted.

The adhering mechanism 30, with the let-off roller 34*a* rotated, lets off the belt-shaped sheet 2 from the sheet roll 2A toward the adhering roller 31. When the belt-shaped sheet 2 is passed between the let-off roller 34*a* and the clamping roller 34*b*, the belt-shaped sheet 2 is separated into the sheet main body 3 and the belt-shaped release film 4 by the peel plate 37, and the sheet main body 3 is sent to the sheet adhering means 36 side by passing through the adhering roller 31. With the moving section 361 moved upward, the sheet main body 3 is pushed up by the cushion 360 and is adhered to the sheet adhered section 28 on the adhesion starting side. In this instance, the clamping roller 34*b* clamps the belt-shaped sheet 2, which is let off from the sheet roll 2A, by approaching the let-off roller 34*b*, thereby preventing the sheet main body 3 from slackening. The peeled belt-shaped release film 4 is passed through the guide roller 34*c* and between the movable roller 34*d* and the presser roller 34*e*, to be taken up onto the take-up roller 38.

Figure 13:
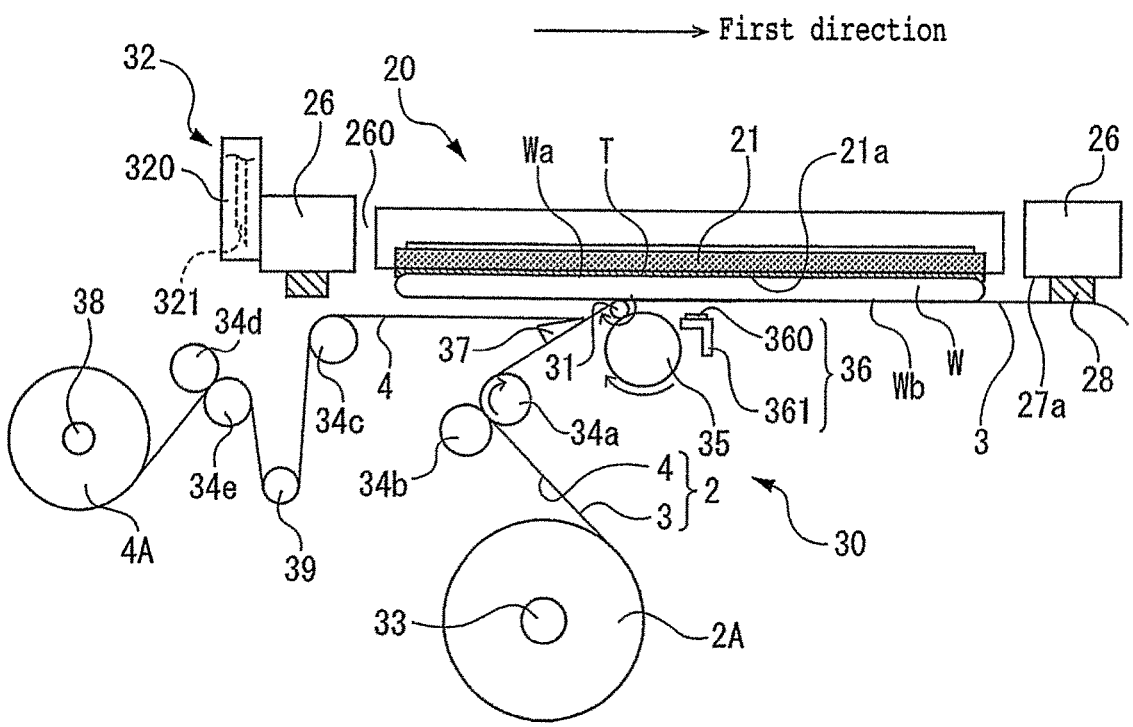
FIG. 13 is a sectional view depicting a state in which in the adhering mechanism, the holding unit is moved horizontally to adhere the base sheet to a plate-shaped body by an adhering roller.

As illustrated in FIG. 13, by the movement of the holding unit 20 for approaching the peeling region in the first direction, the back surface Wb of the plate-shaped body W is brought into contact with the upper surface of the sheet main body 3, and the sheet main body 3 is adhered to the back surface Wb of the plate-shaped body W while rotating the adhering roller 8 along the roller guides 29 depicted in FIG. 5C and while pressing upward the lower surface of the sheet main body 3. In this instance, the flexure preventing roller 35 rotates in such a manner as to press the sheet main body 3 against the adhering roller 31, and, therefore, flexure of the sheet main body 3 can be prevented.

While the sheet main body 3 is being adhered to the back surface Wb of the plate-shaped body W, it is desirable to control the operation of adhering the sheet main body 3 to the plate-shaped body W, by a process in which while letting off a predetermined quantity of the belt-shaped sheet 2 from the sheet roll 2A by torque control of the let-off roller 34*a*, the plate-shaped body holding section 21 is moved in such a manner that the tension (load) exerted on the motor 42 of the moving means 40 depicted in FIG. 1 will be constant. By this, the sheet main body 3 to be adhered to the back surface Wb of the plate-shaped body W can be prevented from wrinkling or cramping. In addition, since the movable roller 34d comes closer to the presser roller 34e and the belt-shaped release film 4 is clamped between the movable roller 34d and the presser roller 34e, the belt-shaped release film 4 is pulled and the sheet main body 3 would not slacken. Further, during when the sheet main body 3 is adhered to the back surface Wb of the plate-shaped body W, the weight 39 always falls, whereby a state in which the belt-shaped release film 4 is pressed downward is maintained. As a result, a constant tension can be exerted on the belt-shaped release film 4, so that wrinkling of the sheet main body 3 is not generated, and the sheet main body 3 can be favorably adhered to the back surface Wb of the plate-shaped body W.

Figure 14:
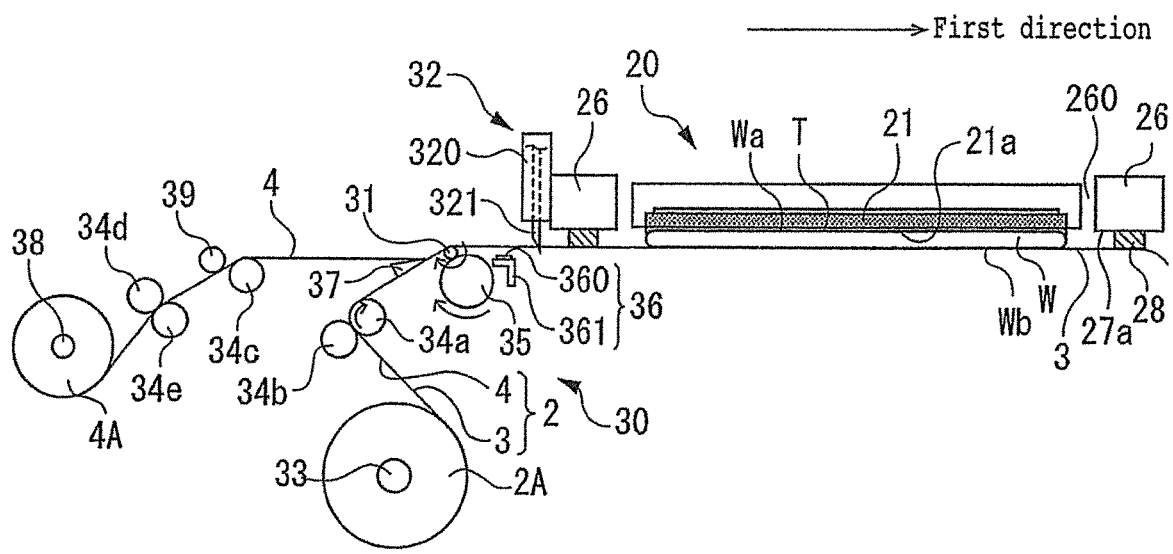
FIG. 14 is a sectional view depicting a state in which in the adhering mechanism, the base sheet adhered to the sheet adhered section on an adhesion finishing side is cut by a cutter.
Figure 15:
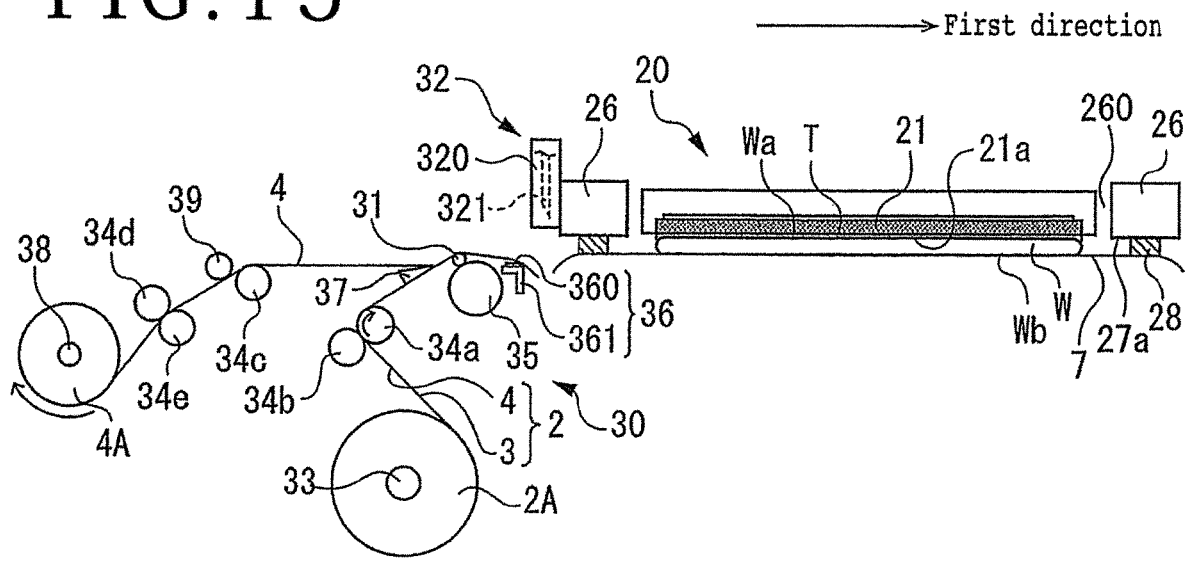
FIG. 15 is a sectional view depicting a state in which a rectangular sheet is adhered to the plate-shaped body.

After the sheet main body 3 is adhered to the whole back surface Wb of the plate-shaped body W and is adhered to the sheet adhered section 28 on the adhesion finishing side, as depicted in FIG. 14, the sheet main body 3 is cut out by the cutter 32. Specifically, the cutter blade 321 is protruded from the cutter accommodating section 320, and is positioned at a height position for cutting the sheet main body 3. Subsequently, the cutter blade 321 is moved in the second direction along the guide rail 323 depicted in FIG. 5B, whereby the sheet main body 3 is cut to the rectangular sheet 7 depicted in FIG. 15. When the rectangular sheet 7 has been adhered to the back surface Wb of the plate-shaped body W and to the sheet adhered sections 28, the operation of adhering the rectangular sheet 7 is completed. At the time of cutting the sheet main body 3, the cutter blade 321 is in the heated state by the cutter heater 322, and, therefore, the glue layer of the sheet main body 3 is not liable to adhere to the cutter blade 321, and the sheet main body 3 can be cut out continuously and smoothly. The belt-shaped release film 4 is taken up by the take-up roller 38, to form the release film roll 4A. Note that when the sheet roll 2A is reduced in diameter and the belt-shaped sheet 2 wound around the reel 33 runs out, it is desirable to draw out the unit main body 300 depicted in FIG. 1 to the exterior of the apparatus and to replace the sheet roll 2A. In addition, when the release film roll 4A is enlarged in diameter, it is recommendable to detach and remove the release film roll 4A at an arbitrary timing.

Figure 16:
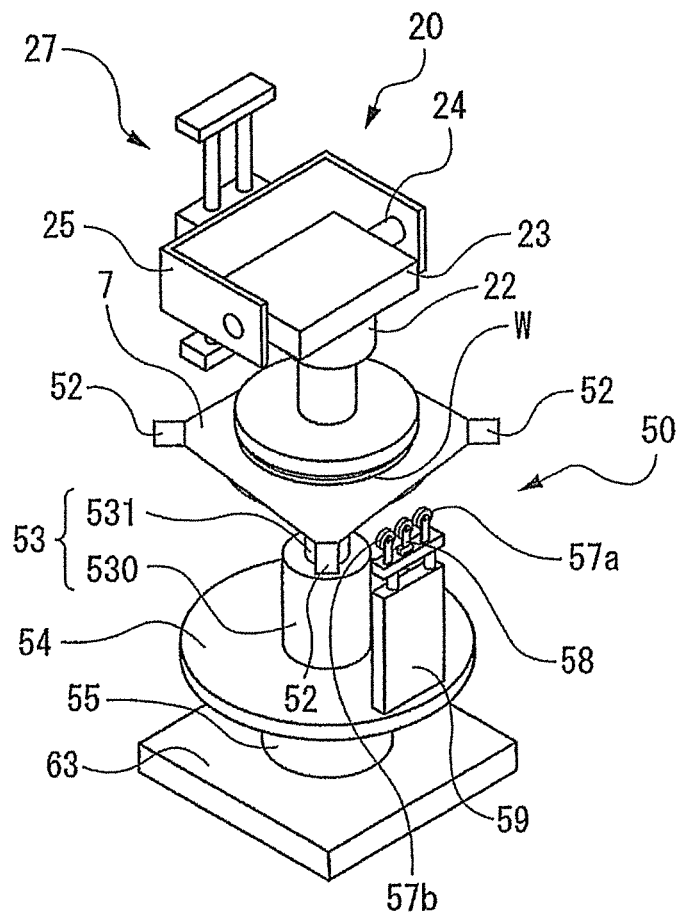
FIG. 16 is a perspective view depicting a state in which the plate-shaped body having the rectangular sheet adhered thereto is transferred from the holding unit to the transfer unit.
Figure 17:
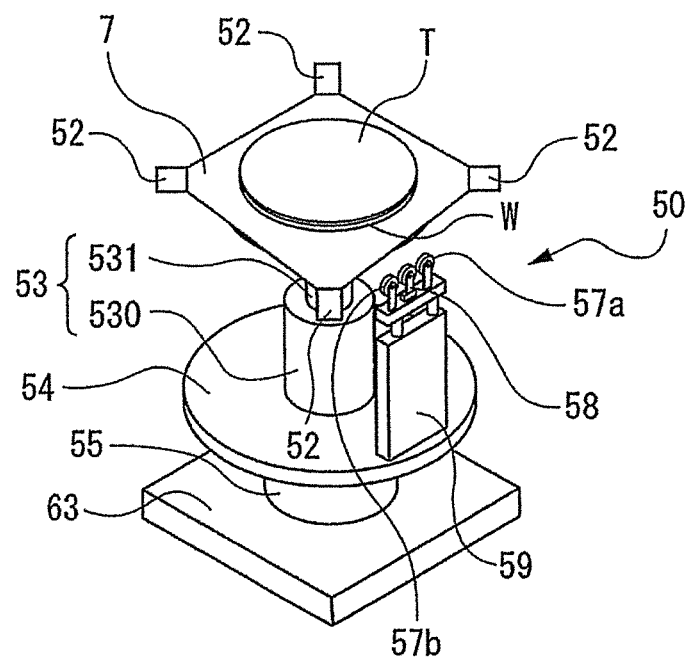
FIG. 17 is a perspective view depicting a state in which the plate-shaped body is held by a holding section of the transfer unit and four corners of the rectangular sheet are clamped by corner portion clamping means.

When the holding unit 20 is moved to the upper side of the transfer unit 50 as depicted in FIG. 16, the plate-shaped body holding section 21 is lowered in the direction for approaching the transfer unit 50 by the lift mechanism 27, the plate-shaped body W is mounted on the holding surface 51a of the transfer unit holding section 51 depicted in FIG. 9 through the rectangular sheet 7, and the corner portions of the rectangular sheet 7 are mounted on the mounting surfaces 520a of the sheet corner portion mounting sections 520. In this instance, a shock at the time of transferring the plate-shaped body W is absorbed by the inclination adjusting mechanism 56, and, therefore, the fear of breakage of the plate-shaped body W can be reduced. Subsequently, the corner portions of the rectangular sheet 7 are clamped by the clamp sections 521. The suction applied to the plate-shaped body W by the plate-shaped holding section 21 is released, and the plate-shaped body W is suction held by the transfer unit holding section 51. In this way, the plate-shaped body W is transferred from the holding unit 20 to the transfer unit 50, whereby a state in which the four corners of the rectangular sheet 7 are clamped by the corner portion clamping means 52 and the plate-shaped body W is held by the transfer unit 50, with the tape T exposed upward, is obtained, as illustrated in FIG. 17.

Figure 18:
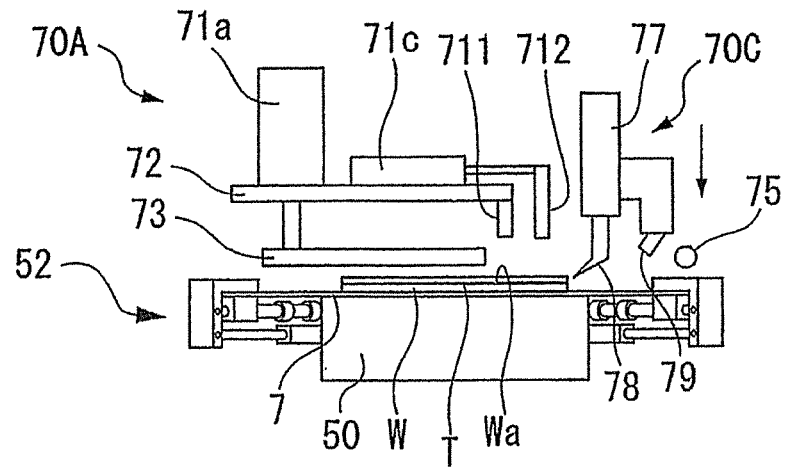
FIG. 18 is a sectional view depicting a state in which a tip needle-shaped member is brought close to the plate-shaped body in the peeling mechanism.

Next, while keeping the state in which the plate-shaped body W is held by the transfer unit 50, the tape T is peeled off from the front surface Wa of the plate-shaped body W by use of the peeling mechanism 70 depicted in FIG. 1. First, as depicted in FIG. 18, the tape holding unit 70A and the peeling start point portion forming means 70C are moved to the upper side of the transfer unit 50. In this case, a slightly outer peripheral portion of an outer peripheral end portion of the tape T adhered to the plate-shaped body W is positioned beneath the tip of the tip needle-shaped member 78 of the peeling start point portion forming means 70C. Thereafter, the fourth air cylinder 71d depicted in FIG. 11C is operated, to lower the tip of the tip needle-shaped member 78 to a position proximate to the outer peripheral end portion of the tape T.

Figure 19:
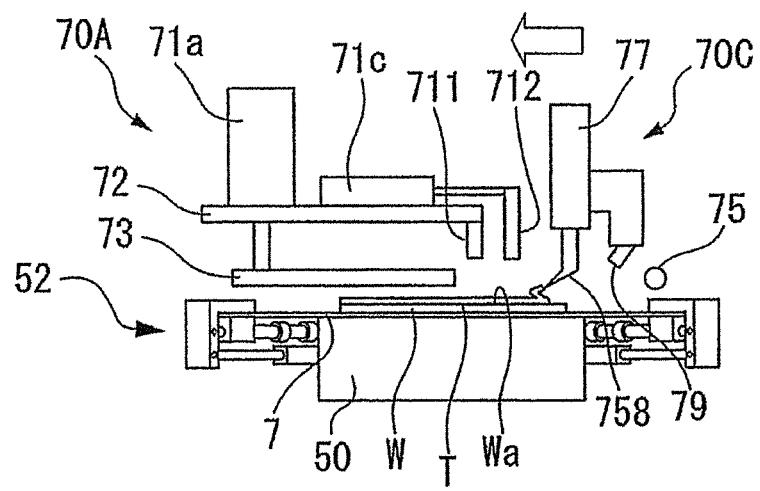
FIG. 19 is a sectional view depicting a state in which the tip needle-shaped member is butted against a peripheral edge side of a tape adhered to the plate-shaped body in the peeling mechanism.

The height of the tip of the tip needle-shaped member 78 is finely adjusted in conformity with the surface height of the tape T such that the tip of the tip needle-shaped member 78 comes proximate to an outer peripheral portion of the tape T, and, in the state in which the tip is proximate, the tape holding unit 70A and the peeling start point portion forming means 70C are moved slightly leftward in the figure, whereby the tip of the tip needle-shaped member 78 is butted against on the outer peripheral portion of the tape T, as depicted in FIG. 19. In this instance, while the four corner portion clamping means 52 are clamping the four corners of the rectangular sheet 7, the tip needle-shaped member 78 is butted against the outer peripheral portion of the tape T from other portion than the four corners of the rectangular sheet 7 depicted in FIG. 17, so that movement of the tip needle-shaped member 78 is not hampered. Note that while the tip of the tip needle-shaped member 78 may be butted from a circumferential directionally outer side of the tape T as illustrated in the figure, the tip of the tip needle-shaped member 78 may be butted from above an outer peripheral portion of the tape T.

After the tip of the tip needle-shaped member 78 is butted against on the outer peripheral portion of the tape T, the fourth air cylinder 71d is operated to move the tip needle-shaped member 78 slightly upward, whereby part of the outer peripheral portion of the tape T is favorably peeled off.

Figure 20:
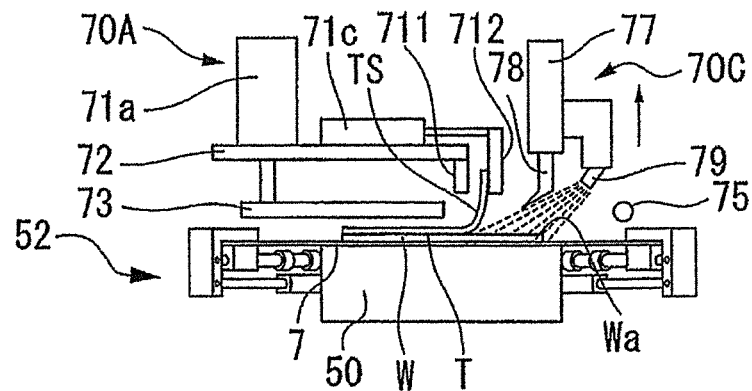
FIG. 20 is a sectional view depicting a state in which high-pressure air is jetted from an air nozzle toward that part of the plate-shaped body from which the tape is peeled off in the peeling mechanism.

After part of the tape T is peeled off, the tip member 77 is moved upward and high-pressure air is jetted from the air nozzle 79, as illustrated in FIG. 20, whereby the outer peripheral portion of the tape T is spaced away from the tip of the tip needle-shaped member 78, the peeling region including that part of the outer peripheral portion of the tape T which has previously been peeled off is enlarged, and a peeling start point portion TS suitable for clamping by the tape holding unit 70A is formed. Note that the height of the holding base 72 in the peeling start point portion forming step is adjusted such that the peeling start point portion TS is accommodated between the clamping pieces 711 and 712 provided on the holding base 72 when the peeling start point portion TS is peeled off by the high-pressure air from the air nozzle 79. In addition, when the high-pressure air is jetted by the air nozzle 79 to enlarge the peeling region, the tip needle-shaped member 78 may be further butted. In this way, the peeling start point portion TS is formed suitably.

Figure 21:
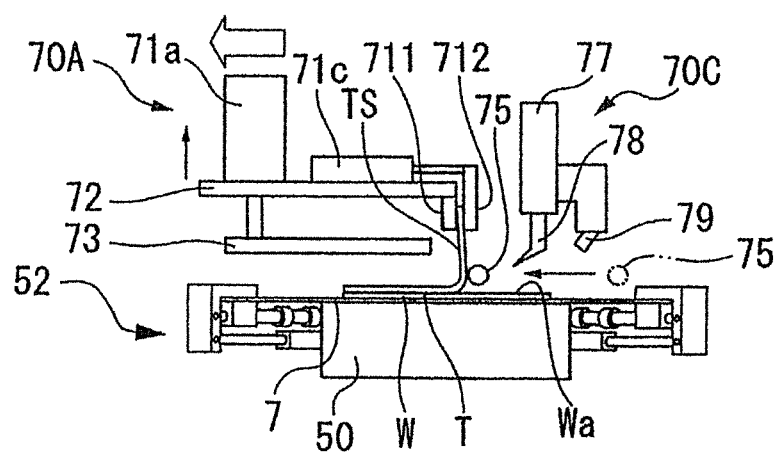
FIG. 21 is a sectional view depicting a state in which a bending roller is moved and brought into contact with the tape, in the peeling mechanism.

After the outer peripheral portion of the tape T is lifted up by the high-pressure air jetted from the air nozzle 79, the third air cylinder 70c is operated to move the clamping piece 712 toward the clamping piece 711 side, as depicted in FIG. 21, whereby the outer peripheral portion of the peeled tape T is clamped between the clamping piece 711 and the clamping piece 712. Then, the first air cylinder 71a is operated, whereby the tape holding unit 70A as a whole is moved upward to such an extent that the bending roller 75 can be made to advance to the lower side of the clamping pieces 711 and 712.

The tape holding unit 70A is moved upward, and the bending roller 75 is moved toward the tape holding unit 70A side. Note that the bending roller 75 causes peeling to proceed while making contact with the adhesive surface of the tape T for the plate-shaped body W, and, for this reason, the bending roller 75 can be rotated around a longitudinal axis thereof, and its surface is coated with a fluororesin such that the adhesive surface of the tape T making contact therewith would not adhere thereto. In the present embodiment, the plate-shaped body W is put into an extremely thin plate shape by grinding, and a small bending angle may cause cracking, breaking or the like of the plate-shaped body W at the time of peeling of the tape T; therefore, it is preferable to perform, as assuredly as possible, the bending at an angle of 180 degrees or an angle approximate to 180 degrees.

Figure 22:
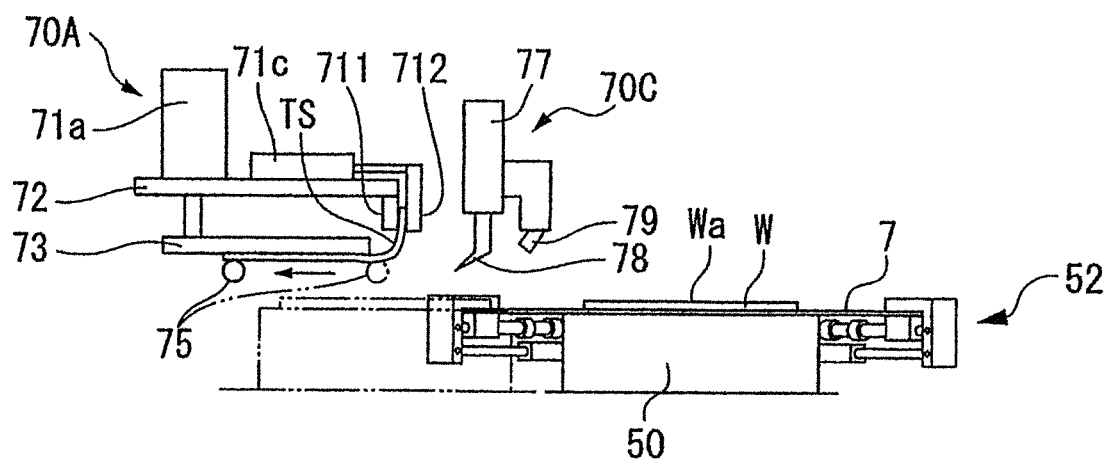
FIG. 22 is a sectional view depicting a state in which the tape is completely peeled off from the plate-shaped body and the tape is suction held onto a lower surface of a holding plate, in the peeling mechanism.

When the bending roller 75 is moved to the other end portion, on the left side in the figure, of the lower surface of the holding plate 73, as depicted in FIG. 22, the tape T is completely peeled off from the front surface Wa of the plate-shaped body W. The tape T peeled off from the front surface Wa of the plate-shaped body W is suction held by the holding plate 73. Then, the clamping piece 712 is spaced away from the clamping piece 711 by operating the third air cylinder 71c, whereby the outer peripheral portion of the tape T is released, and is disposed of into a disposal vessel, for example.

Figure 23:
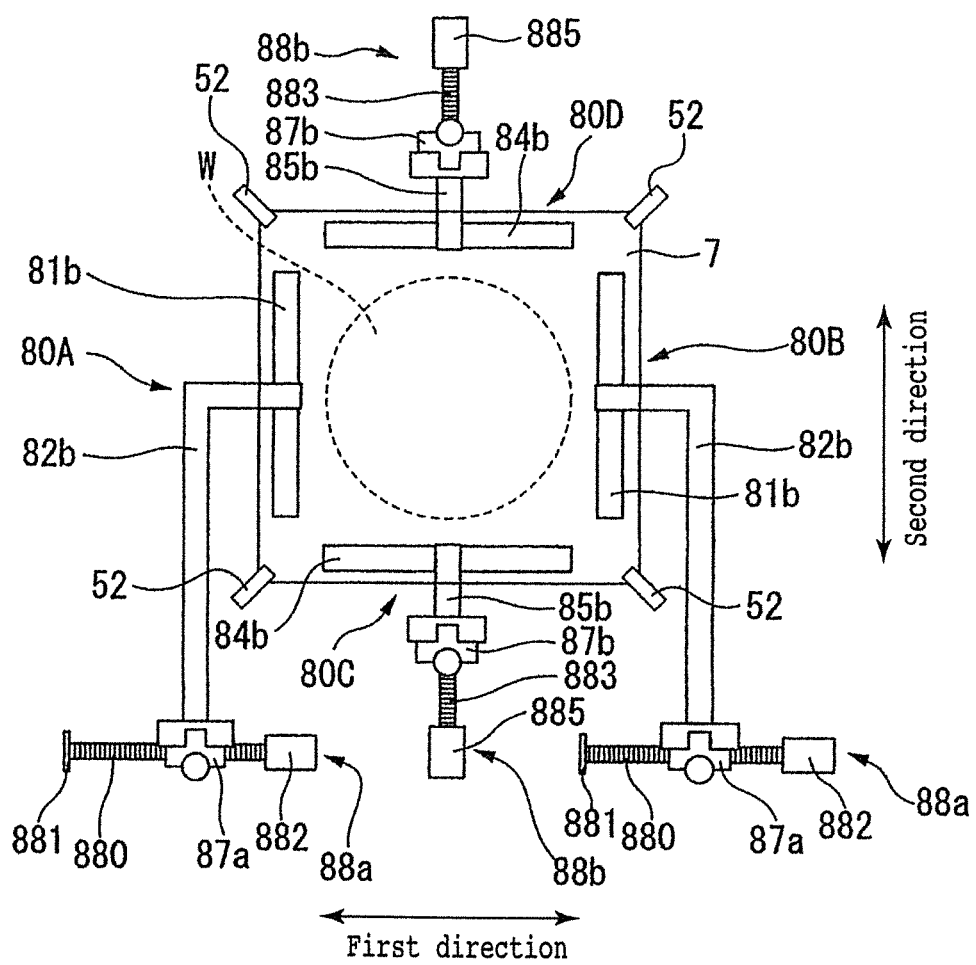
FIG. 23 is a plan view for explaining a state in which four sides of a rectangular sheet are clamped by an expanding mechanism.

Next, the transfer unit 50 is moved to a position beneath the expanding mechanism 80 by the transfer unit moving means 60 depicted in FIG. 1, and the plate-shaped body W with the rectangular sheet 7 adhered thereto is transferred to the expanding mechanism 80. Specifically, as depicted in FIG. 23, the two first direction moving means 88a are operated to move the movable bases 87a horizontally in the first direction such that the first clamping means 80A and the second clamping means 80B are brought closer to each other. In addition, the two second direction moving means 88b are operated to move the movable bases 87b horizontally in the second direction such that the third clamping means 80C and the fourth clamping means 80D are brought close to each other. In this case, while the corner portion clamping means 52 are clamping the four corners of the rectangular sheet 7, other portions than the four corners of the rectangular sheet 7 are clamped by the first clamping means 80A to the fourth clamping means 80D, so that movements of the first clamping means 80A to the fourth clamping means 80D in the first direction and the second direction are not hampered.

Figure 24:
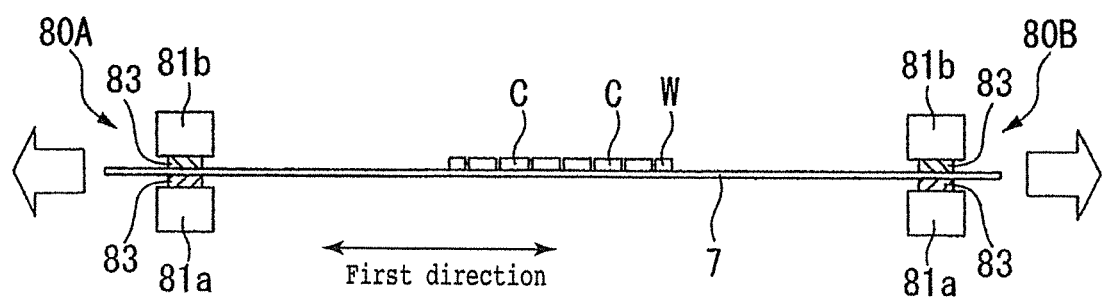
FIG. 24 is a sectional view depicting a state in which the rectangular sheet is expanded in a first direction by first clamping means and second clamping means.
Figure 25:
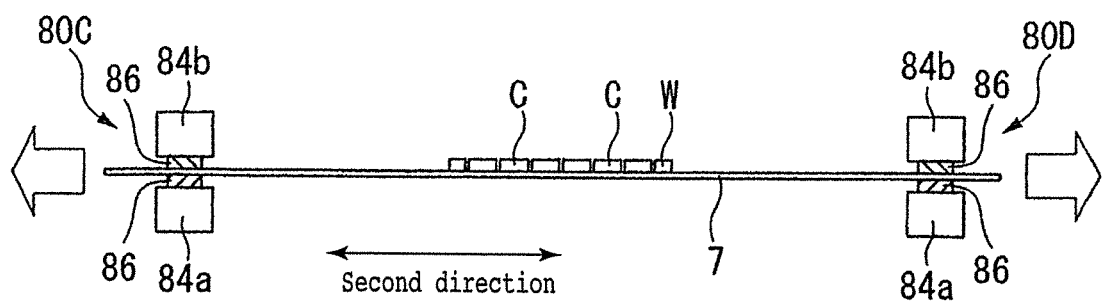
FIG. 25 is a sectional view depicting a state in which the rectangular sheet is expanded in a second direction by third clamping means and fourth clamping means.

Subsequently, the rectangular sheet 7 is clamped by the first clamping means 80A and the second clamping means 80B which face each other on opposite sides of the plate-shaped body W in the first direction, and the rectangular sheet 7 is clamped by the third clamping means 80C and the fourth clamping means 80D which face each other on opposite sides of the plate-shaped body W in the second direction orthogonal to the first direction. Specifically, the lower-side clamping sections 81a of the first clamping means 80A and the second clamping means 80B depicted in FIG. 24 are moved upward, whereas the upper-side clamping sections 81b are moved downward, by the lift mechanisms, whereby the roller 83 of the lower-side clamping section 81a presses the lower surface of the rectangular sheet 7, whereas the roller 83 of the upper-side clamping section 81b presses the upper surface of the rectangular sheet 7, resulting in that the upper and lower surfaces of the rectangular sheet 7 are clamped. In addition, the lower-side clamping sections 84a of the third clamping means 80C and the fourth clamping means 80D depicted in FIG. 25 are moved upward, whereas the upper-side clamping sections 84a are moved downward, by the lift mechanisms, whereby the roller 86 of the lower-side clamping section 84a presses the lower surface of the rectangular sheet 7, whereas the roller 86 of the upper-side clamping roller 84b presses the upper surface of the rectangular sheet 7, resulting in that the upper and lower surfaces of the rectangular sheet 7 are clamped. Then, suction holding of the plate-shaped body W by the transfer unit holding section 51 illustrated in FIG. 17 is released, the clamping of the corner portions of the rectangular sheet 7 by the corner portion clamping means 52 is released, and the plate-shaped body W is transferred to the expanding mechanism 80. In this way, according to the transfer unit 50, the state in which the corner portions of the rectangular sheet 7 adhered to the plate-shaped body W are clamped by the corner portion clamping means 52 is maintained until the plate-shaped body W is transferred to the expanding mechanism 80, and, therefore, the plate-shaped body W can be reliably transferred to the expanding mechanism 80 without being broken or damaged.

After the plate-shaped body W is transferred to the expanding mechanism 80, the rectangular sheet 7 is expanded in the first direction to form gaps between individual chips C, as illustrated in FIG. 24. Specifically, in the state in which the rectangular sheet 7 is clamped by the first clamping means 80A and the second clamping means 80B, the first clamping means 80A and the second clamping means 80B are moved in the manner of spacing away from each other in the first direction. Specifically, the two first direction moving means 88a depicted in FIG. 23 are operated, to move the movable bases 87a in the first direction such that the first clamping means 80A and the second clamping means 80B are spaced away from each other, whereby the rectangular sheet 7 clamped between the rollers 83 of the lower-side clamping sections 81a and the rollers 83 of the upper-side clamping sections 81a is pulled toward the outer sides. As the rectangular sheet 7 is expanded, the gap between the adjacent chips C is widened, whereby sufficient gaps can be formed between the chips C. By this, the adjacent chips C can be prevented from making contact with each other when the plate-shaped body W is carried.

Subsequently, the rectangular sheet 7 is expanded in the second direction to form gaps between the individual chips C, as illustrated in FIG. 25. Specifically, in the state in which the rectangular sheet 7 is clamped by the third clamping means 80C and the fourth clamping means 80D, the third clamping means 80C and the fourth clamping means 80D are moved in the manner of spacing away from each other in the second direction. Specifically, the two second direction moving means 88b depicted in FIG. 23 are operated, to move the movable bases 87b in the second direction such that the third clamping means 80C and the fourth clamping means 80D are spaced away from each other, whereby the rectangular sheet 7 clamped between the rollers 86 of the lower-side clamping sections 84a and the rollers 86 of the upper-side clamping sections 84b is pulsed toward the outer sides. As the rectangular sheet 7 is expanded, the gap between the adjacent chips C is widened, whereby sufficient gaps can be formed between the chips C. By this, the adjacent chips C can be prevented from making contact with each other when the plate-shaped body W is carried. Note that while the expansion of the rectangular sheet 7 in the second direction is conducted after the expansion in the first direction in the present embodiment, this is not restrictive; the expansion in the first direction and the expansion in the second direction may be performed simultaneously, or the expansion in the first direction may be carried out after the expansion in the second direction. In addition, the amount of expansion of the rectangular sheet 7 in the first direction and the amount of expansion in the second direction may be equal or may be different.

Here, in the case where there is an undivided region in which the plate-shaped body W expanded by the expansion in the first direction and the expansion in the second direction has not been divided into the individual chips C (a region in which the plate-shaped body W has not been divided with the modified layers as start points of division), an external force is exerted on the plate-shaped body W by, for example, a squeegee or the like, though not illustrated, to thereby divide the plate-shaped body W into the individual chips C. Note that the division of the undivided region is conducted at least before the frame adhesion to be described later is performed.

Figure 26:
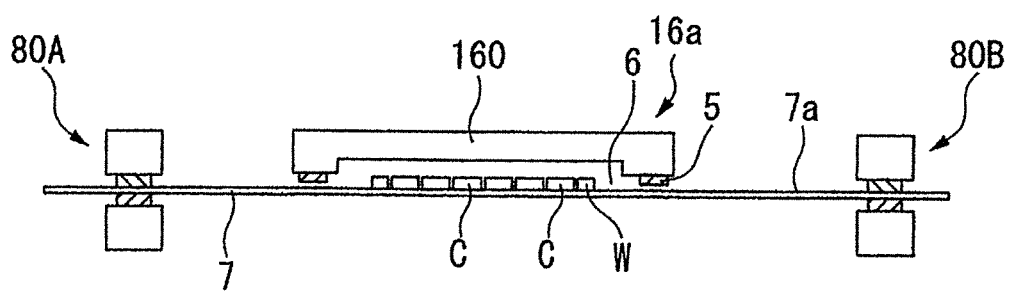
FIG. 26 is a sectional view depicting a state in which an opening of a frame is positioned at the plate-shaped body after expansion.

As depicted in FIG. 26, the frame 5 is made to face the rectangular sheet 7 by the first carrying means 16a. First, the first carrying means 16a suction holds the frame 5 accommodated in the frame stocker 17 depicted in FIG. 3 by the frame holding sections 161, carries out the frame 5, and moves the frame 5 to the upper side of the rectangular sheet 7. Subsequently, in a state in which the rectangular sheet 7 is clamped by the first clamping means 80A to the fourth clamping means 80D, the frame 5 is made to face the upper surface 7a of the rectangular sheet 7, and the plate-shaped body W is positioned to the inside of the opening 6 of the frame 5.

Figure 27:
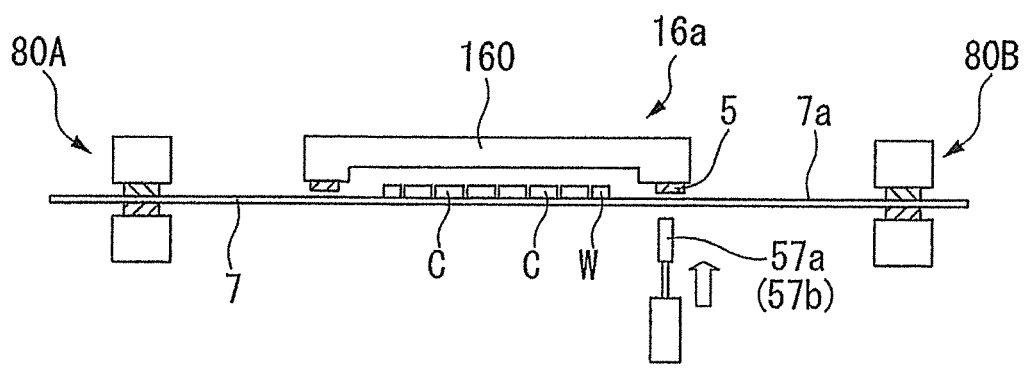
FIG. 27 is a sectional view depicting a state in which the rectangular sheet is adhered to the frame by a frame adhering roller.

Next, as illustrated in FIG. 27, the rectangular sheet 7 is adhered to the frame 5 positioned to face the upper surface 7a of the rectangular sheet 7. Specifically, the frame adhering rollers 57a and 57b are moved upward by the lift mechanisms, to bring the frame adhering rollers 57a and 57b into contact with the lower surface of the rectangular sheet 7. Subsequently, the circular disk 54 depicted in FIG. 8 is rotated at least one revolution, whereby the frame adhering rollers 57a and 57b are moved circularly along the frame 5, and, while performing this operation, the lower surface of the rectangular sheet 7 is pressed upward, whereby the upper surface 7a of the rectangular sheet 7 is adhered to the frame 5. In this instance, the frame adhering rollers 57a and 57b are being heated by the heaters, and, therefore, adhesion of the rectangular sheet 7 to the frame 5 can be enhanced, and the rectangular sheet 7 can be favorably adhered to the frame 5. After the rectangular sheet 7 is adhered to the frame 5, the frame adhering rollers 57a and 57b are lowered to be retracted from the rectangular sheet 7.

Figure 28:
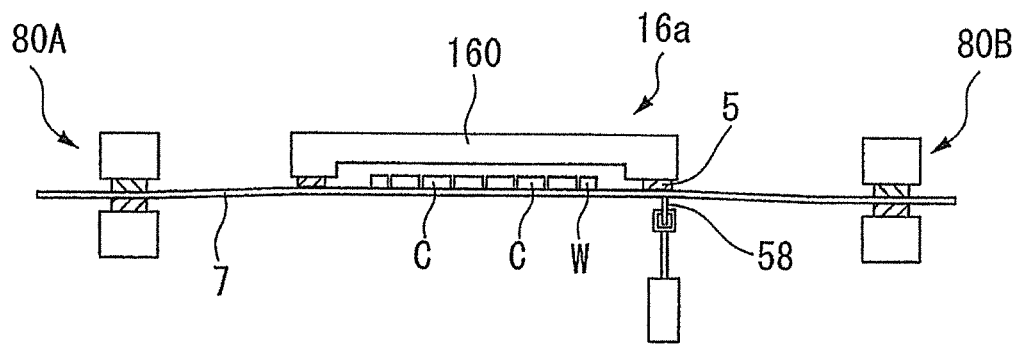
FIG. 28 is a sectional view depicting a state in which the rectangular sheet is cut along the frame by a frame adhesion cutter.

As depicted in FIG. 28, the rectangular sheet 7 is cut along the frame 5. Specifically, the frame adhesion cutter 58 is moved up by the lift mechanism to cut into the rectangular sheet 7, and the circular disk 54 depicted in FIG. 8 is rotated at least one revolution, whereby the frame adhesion cutter 58 is moved circularly along the frame 5, to cut the rectangular sheet 7.

Figure 29:
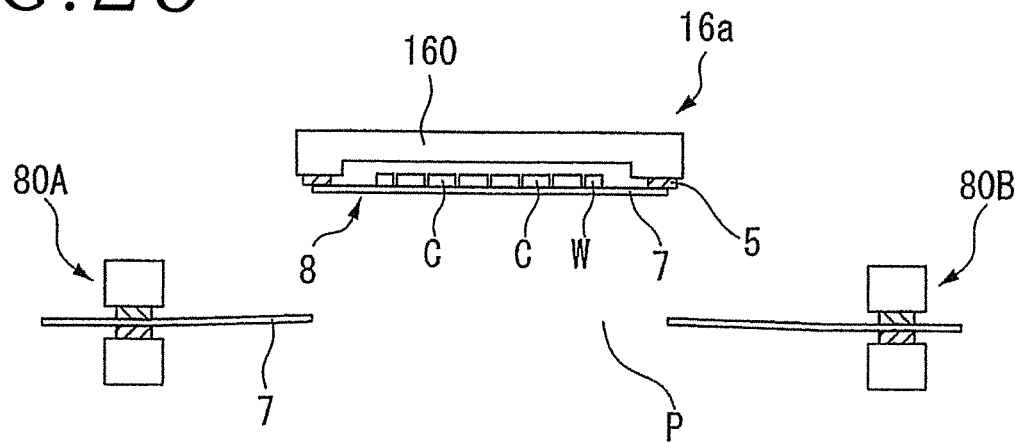
FIG. 29 is a sectional view depicting a state in which a frame unit is carried.

As illustrated in FIG. 29, the frame unit 8 in which the plate-shaped body W is adhered to the frame 5 through the rectangular sheet 7 is formed. The first carrying means 16a moves upward in the state of holding the frame unit 8, to carry out the frame unit 8 from the position P where the rectangular sheet 7 has been cut. The frame unit 8 is temporarily placed on a temporary base (not depicted) disposed at a lateral side of the frame stocker 17 depicted in FIG. 3. Thereafter, the frame unit 8 is carried out from the temporary base and carried to the cleaning apparatus region by the second carrying means 16b depicted in FIG. 2, and a cleaning treatment and a drying treatment are performed by the cleaning apparatus 18. Then, the frame unit 8 is carried to a UV ray applying region, where UV rays are applied to the rectangular sheet 7 of the frame unit 8 by the UV ray applying apparatus, thereby performing a curing treatment.

In this way, the sheet expanding apparatus 1 according to the present invention includes: the adhering mechanism 30 including the adhering roller 31 by which the belt-shaped sheet 2 wound in a roll form is adhered to the plate-shaped body W held by the holding unit 20, and the cutter 32 adapted to cut the belt-shaped sheet 2 into the rectangular sheet 7 larger in size than the plate-shaped body W; the moving means 40 moving the adhering roller 31 relative to the holding unit 20 in the adhering direction for adhering the belt-shaped sheet 2; the expanding mechanism 80 adapted to expand the rectangular sheet 7 in the first direction and the second direction; and the transfer unit 50 by which the plate-shaped body W held by the holding unit 20 and having the rectangular sheet 7 adhered thereto is transferred to the expanding mechanism 80. Therefore, when the belt-shaped sheet 2 wound in the roll form is adhered to the plate-shaped body W held by the holding unit 20, thereafter the rectangular sheet 7 is cut out by the cutter 32, and the plate-shaped body W is transferred to the expanding mechanism 80 by the transfer unit 50, the rectangular sheet 7 can thereby be expanded. According to the present invention, the belt-shaped sheet 2 can be supplied to the sheet expanding apparatus 1 in the state of being wound in the roll form, the belt-shaped sheet 2 can be adhered to the plate-shaped body W in the sheet expanding apparatus 1, and can be cut out into the rectangular sheet 7 larger in size than the plate-shaped body W, so that workability is enhanced as compared to the related art.

Further, at the time of adhering the belt-shaped sheet 2 to the plate-shaped body W, the state in which the plate-shaped body W is held by the holding unit 20 is maintained; in addition, after the rectangular sheet 7 is adhered to the plate-shaped body W and until it is transferred to the expanding mechanism 80, the state in which the plate-shaped body W is held by the transfer unit 50 is maintained; further, after the plate-shaped body W is transferred to the expanding mechanism 80 and until the rectangular sheet 7 is attached to the annular frame 5, the state in which the outer edges of the rectangular sheet 7 are clamped by the first clamping means 80A, the second clamping means 80B, the third clamping means 80C and the fourth clamping means 80D is maintained. Therefore, the possibility of breaking or damaging the plate-shaped body W can be lowered.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A sheet expanding apparatus for expanding a sheet, comprising:
   a holding unit having a holding surface adapted to hold a plate-shaped body;
   an adhering mechanism including an adhering roller by which a belt-shaped sheet wound in a roll form is adhered to the plate-shaped body held by the holding unit, and a cutter adapted to cut the belt-shaped sheet into a rectangular sheet larger in size than the plate-shaped body;

moving means moving the adhering roller relative to the holding unit in an adhering direction of adhering the belt-shaped sheet;

an expanding mechanism including first clamping means and second clamping means which are disposed oppositely on opposite sides of the plate-shaped body with the rectangular sheet adhered thereto in regard of a first direction and which clamp outer edges of the rectangular sheet adhered to the plate-shaped body by the adhering mechanism, third clamping means and fourth clamping means which are disposed oppositely on opposite sides of the plate-shaped body with the rectangular sheet adhered thereto in regard of a second direction orthogonal to the first direction and which clamp outer edges of the rectangular sheet, and direction moving means by which the first clamping means and the second clamping means can be moved for spacing away from each other in the first direction and by which the third clamping means and the fourth clamping means can be moved for spacing away from each other in the second direction; and a transfer unit by which the plate-shaped body being held by the holding unit and having the rectangular sheet adhered thereto is transferred to the expanding mechanism.

2. The sheet expanding mechanism according to claim 1, wherein the holding unit includes:

a plate-shaped body holding section which includes the holding surface and holds the plate-shaped body, and sheet adhered sections which are disposed on an adhesion starting side and an adhesion finishing side on opposite sides of the holding surface in regard of the adhering direction in a periphery of the plate-shaped body holding section and which protrude beyond a sheet adhered surface of the plate-shaped body held by the holding surface; and the adhering mechanism includes:

a let-off section which is disposed to face the plate-shaped body held by the holding unit and lets off the belt-shaped sheet wound in the roll form, and sheet adhering means adhering one end of the belt-shaped sheet let off by the let-off section to the sheet adhered section on the adhesion starting side.

3. The sheet expanding apparatus according to claim 1, wherein the transfer unit includes:

a transfer unit holding section by which the plate-shaped body being held by the holding unit and having the rectangular sheet adhered thereto is held through the rectangular sheet, and corner portion clamping means respectively clamping corner portions of the rectangular sheet in a periphery of the transfer unit holding section.

4. The sheet expanding apparatus according to claim 1, wherein the belt-shaped sheet includes a base sheet and a glue layer disposed on the base sheet, and is wound in the roll form in a state in which a belt-shaped release film is disposed on the glue layer; and the adhering mechanism includes:

a peel plate adapted to peel off the belt-shaped release film from the belt-shaped sheet let off by the let-off section, a take-up section adapted to take up the peeled belt-shaped release film, and a weight adapted to press down the belt-shaped release film between the peel plate and the take-up section.

* * * * *